(12) United States Patent
Fukami et al.

(10) Patent No.: US 10,020,039 B2
(45) Date of Patent: Jul. 10, 2018

(54) THREE TERMINAL MAGNETORESISTIVE DEVICES, MAGNETORESISTIVE RANDOM ACCESS MEMORY AND MAGNETIC RECORDING METHOD

(71) Applicants: NEC CORPORATION, Tokyo (JP); TOHOKU UNIVERSITY, Sendai-shi, Miyagi (JP)

(72) Inventors: Shunsuke Fukami, Sendai (JP); Michihiko Yamanouchi, Sendai (JP); Hideo Ohno, Sendai (JP)

(73) Assignee: TOHOKU UNIVERSITY, Sendai-Shi, Miyagi (JP)

( * ) Notice: Subject to any disclaimer, the term of this patent is extended or adjusted under 35 U.S.C. 154(b) by 0 days.

(21) Appl. No.: 15/144,715

(22) Filed: May 2, 2016

(65) Prior Publication Data

US 2016/0247550 A1   Aug. 25, 2016

Related U.S. Application Data

(63) Continuation of application No. PCT/JP2014/076643, filed on Sep. 30, 2014.

(30) Foreign Application Priority Data

Nov. 6, 2013   (JP) ................................. 2013-229971

(51) Int. Cl.
*G11C 11/16* (2006.01)
*H01L 43/08* (2006.01)
(Continued)

(52) U.S. Cl.
CPC ........ *G11C 11/161* (2013.01); *G11C 11/1655* (2013.01); *G11C 11/1659* (2013.01);
(Continued)

(58) Field of Classification Search
CPC .............. G11C 11/161; G11C 11/1675; G11C 11/1673; H01L 43/10; H01L 23/528; H01L 27/228; H01L 43/02; H01L 43/08
See application file for complete search history.

(56) References Cited

U.S. PATENT DOCUMENTS

2006/0237808 A1* 10/2006 Saito ...................... G11C 11/16
                                                                  257/421
2010/0188890 A1*  7/2010 Fukami .................. B82Y 10/00
                                                                  365/158
(Continued)

FOREIGN PATENT DOCUMENTS

| JP | 2011-119537 A | 6/2011 |
|---|---|---|
| WO | WO-2010/026861 A1 | 3/2010 |
| WO | WO-2013/025994 A2 | 2/2013 |

OTHER PUBLICATIONS

N. Sakimura et al., "MRAM Cell Technology for Over 500-MHz SoC", IEEE Journal of Solid-State Circuits, vol. 42, No. 4, pp. 830-838, Apr. 2007.
H. Numata et al., "Scalable Cell Technology Utilizing Domain Wall Motion for High-speed MRAM", 2007 Symposium on VLSI Technology, Digest of Technical Papers, pp. 232-233, Jun. 2007.
S. Fukami et al., "Low-Current Perpendicular Domain Wall Motion Cell for Scalable High-Speed MRAM", 2009 Symposium on VLSI Technology, Digest of Technical Papers, pp. 230-231, Jun. 2009.
(Continued)

*Primary Examiner* — Richard Elms
*Assistant Examiner* — Jerome Leboeuf
(74) *Attorney, Agent, or Firm* — Rabin & Berdo, P.C.

(57) ABSTRACT

A magnetoresistive device includes a magnetic free layer having first and second surfaces, the magnetic free layer being comprised of a ferromagnetic material having a perpendicular magnetic anisotropy, a spin current generation layer contacting the first surface of the magnetic free layer, a tunnel barrier layer having one surface contacting the second surface of the magnetic free layer, a reference layer contacting another surface of the tunnel barrier layer, and a leakage field generation layer including first and second leakage field generation layers each of which is comprised of a ferromagnetic material and generates a leakage field, an
(Continued)

in-plane component of the leakage field at an part of the magnetic free layer is formed generating a domain wall having an in-plane magnetization component in the magnetic free layer.

17 Claims, 24 Drawing Sheets

(51) Int. Cl.
    *H01L 23/528* (2006.01)
    *H01L 27/22* (2006.01)
    *H01L 43/02* (2006.01)
    *H01L 43/10* (2006.01)

(52) U.S. Cl.
    CPC ........ *G11C 11/1675* (2013.01); *H01L 23/528* (2013.01); *H01L 27/228* (2013.01); *H01L 43/02* (2013.01); *H01L 43/08* (2013.01); *H01L 43/10* (2013.01); *G11C 11/1673* (2013.01)

(56) References Cited

U.S. PATENT DOCUMENTS

| | | |
|---|---|---|
| 2011/0163402 A1 | 7/2011 | Fukami et al. |
| 2013/0075847 A1* | 3/2013 | Honjou ............. B82Y 25/00 257/421 |
| 2014/0169088 A1* | 6/2014 | Buhrman ............. G11C 11/18 365/158 |

OTHER PUBLICATIONS

A. Thiaville et al., "Dynamics of Dzyaloshinskii domain walls in ultrathin magnetic films", Europhysics Letters, vol. 100, pp. 57002-p1~57002-p6, Dec. 2012.

S. Emori et al., "Current-driven dynamics of chiral ferromagnetic domain walls", Nature Materials, DOI: 10.1038/NMAT3675, pp. 1-6, Jun. 2013.

K.-S. Ryu et al., "Chiral spin torque at magnetic domain walls", Nature Nanotechnology, DOI:10.1038/NNANO.2013.102, pp. 1-7, Jun. 2013.

* cited by examiner

THREE TERMINAL MAGNETORESISTIVE DEVICES, MAGNETORESISTIVE RANDOM ACCESS MEMORY AND MAGNETIC RECORDING METHOD

CROSS-REFERENCE TO RELATED APPLICATION

This application is a bypass continuation application of International Application number PCT/JP2014/076643, filed on Sep. 30, 2014 and designating the United States. Furthermore, this application claims the benefit of foreign priority of Japanese application 2013-229971, filed on Nov. 6, 2013. The disclosures of these earlier applications are hereby incorporated herein by reference.

BACKGROUND OF THE INVENTION

Technical Field

The present invention relates to a magnetoresistive device, a magnetoresistive random access memory (MRAM) using the magnetoresistive device, and a magnetic recording method.

Background Art

A magnetic memory, a magnetic random access memory or a magnetoresistive random access memory (MRAM), is a limitlessly rewritable nonvolatile memory, now being substituted for SRAM (Static Random Access Memory), DRAM (Dynamic Random Access Memory), NOR-Flash or the like. The substitution of MRAM for SRAM, DRAM or the like allows a reduction of power consumption because MRAM stores information in a nonvolatile manner.

Non-Patent Literature 1 discloses that, among MRAM, a three-terminal MRAM having a three-terminal cell structure has a circuit structure suitable for high-speed operation and thus is capable of high-speed operation of the same level as current SRAM.

Non-Patent Literature 2 discloses that, among three-terminal MRAM, a three-terminal domain wall motion MRAM using electrical current-induced domain wall motion is suitable for application to leading-edge LSI generation because it allows reduction of a write current and writing speed with a decrease in device size.

Non-Patent Literature 3 discloses that MRAM with a small write current and high heat stability is provided by use of a material with a perpendicular magnetic anisotropy for a layer where writing using current induced domain wall motion is done.

In a three-terminal domain wall motion MRAM, it is desirable that an electric current required for driving a domain wall by means of an electric current is small and a domain wall motion speed is high.

Non-Patent Publications 4, 5 and 6 experimentally and technically disclose that a domain wall (DW) can move at high speed with a small electric current when a spin current flows, by the spin Hall effect, from a layer contacting the domain wall whose rotational direction is substantially determined by the Dzyaloshinskii-Moriya interaction.

CITATION LIST

Non-Patent Literature

NPL1: N. Sakimura, T. Sugibayashi, T. Honda, H. Honjo, S. Saito, T. Suzuki, N. Ishiwata, and S. Tahara: IEEE Journal of Solid-State Circuits, vol. 42, no. 4, p. 830 (2007)

NPL2: H. Numata, T. Suzuki, N. Ohshima, S. Fukami, K. Nagahara, N. Ishiwata, and N. Kasai: 2007 Symposium on VLSI Technology, Digest of Technical Papers, p. 232 (2007)

NPL3: S. Fukami, T. Suzuki, K. Nagahara, N. Ohshima, Y. Ozaki, S. Saito, R. Nebashi, N. Sakimura, H. Honjo, K. Mori, C. Igarashi, S. Miura, N. Ishiwata, and T. Sugibayashi: 2009 Symposium on VLSI Technology, Digest of Technical Papers, p. 230 (2009)

NPL4: A. Thiaville, S. Rohart, E. Jue, V. Cros, A. Fert: Europhysics Letters, vol. 100, p. 57002 (2012)

NPL5: S. Emori, U. Bauer, S.-M. Ahn, E. Martinez, and G. D. S. Beach: Nature Materials, DOI: 10.1038/NMAT3675 (2013)

NPL6: K.-S. Ryu, L. Thomas, S.-H. Yang, and S. Parkin: Nature Nanotechnology, DOI:10.1038/NNANO.2013.102 (2013)

SUMMARY OF THE INVENTION

To put a three-terminal domain wall motion MRAM using current induced domain wall motion into practical use, good nonvolatility, such as maintaining information for as long as ten years, for example, is needed. To achieve this, it is required that a domain wall is constrained by a constraint mechanism when not in motion, and the constraint mechanism is strong enough to be robust against heat and disturbance like magnetic disturbance. On the other hand, when driving a domain wall with an electric current, it is desirable to allow the domain wall to escape from the constraint mechanism with a small electric current. The previous studies have not been able to find a system that can be driven with a small electric current while having sufficient data storage capabilities.

A magnetoresistive random access memory according to an aspect of the present invention includes a magnetoresistive device. The magnetoresistive device includes a magnetic free layer having first and second surfaces, the magnetic free layer being comprised of a ferromagnetic material having a perpendicular magnetic anisotropy, a spin current generation layer contacting the first surface of the magnetic free layer, a tunnel barrier layer having one surface contacting the second surface of the magnetic free layer, a reference layer contacting another surface of the tunnel barrier layer, and a leakage field generation layer including first and second leakage field generation layers each of which is comprised of a ferromagnetic material and generates a leakage field, an in-plane component of the leakage field at an part of the magnetic free layer is formed generating a domain wall having an in-plane magnetization component in the magnetic free layer.

A magnetoresistive device according to another aspect of the invention includes a magnetic free layer having a domain wall, a spin current generation layer contacting the magnetic free layer, and a leakage field generation layer that generates a leakage field, the leakage field determining a magnetization direction of the domain wall formed in the magnetic free layer.

A magnetoresistive random access memory according to another aspect of the invention includes a magneto resistive device that includes a magnetic free layer having first and second surfaces, the magnetic free layer being comprised of a ferromagnetic material having a perpendicular magnetic anisotropy, a spin current generation layer contacting the first surface of the magnetic free layer, a tunnel barrier layer having one surface contacting the second surface of the magnetic free layer, a reference layer contacting another surface of the tunnel barrier layer, and a leakage field generation layer including first and second leakage field generation layers each of which is comprised of a ferromagnetic material and generates a leakage field, an in-plane component of the leakage field at an part of the magnetic free layer is formed generating a domain wall having an in-plane magnetization component in the magnetic free layer. The magnetoresistive random access memory further includes a first cell transistor connected to the first leakage field generation layer, a first bit line connected to the first cell transistor, a second cell transistor connected to the second leakage field generation layer, a second bit line connected to the second cell transistor, and a word line connected to the first and second transistors.

A method of recording information according to another aspect of the invention uses a magnetoresistive device that includes a spin current generation layer, a magnetic free layer having a domain wall and a leakage field generation layer generating a leakage field. The method includes generating a spin current by flowing electric current in the spin current generation layer, moving the domain wall in the magnetic free layer by the generated spin current, and stabilizing a position of the domain wall by the leakage field generated in the leakage field generation layer, thereby recording the information corresponding to the position of the domain wall.

According to the present invention, it is possible to independently design data storage capabilities and a write current of MRAM using domain wall motion driven by the spin Hall effect, thereby achieving high data storage capabilities and a small write current at the same time.

BRIEF DESCRIPTION OF THE DRAWINGS

FIG. 1A is a schematic diagram showing one example of a magnetoresistive device according to the first exemplary embodiment, and FIG. 1B is a schematic diagram showing the structure of a magnetic free layer of the magnetoresistive device according to the first exemplary embodiment.

FIG. 2A is a schematic diagram showing the magnetization structure where "0" is stored in the magnetoresistive device according to the first exemplary embodiment, and FIG. 2B is a schematic diagram showing the magnetization structure where "1" is stored in the magnetoresistive device according to the first exemplary embodiment.

FIG. 3A is a schematic diagram of a clockwise domain wall of the magnetoresistive device according to the first exemplary embodiment, and FIG. 3B is a schematic diagram of a counterclockwise domain wall of the magnetoresistive device according to the first exemplary embodiment.

FIG. 4A is a schematic diagram showing the relationship between the rotational direction of a domain wall of the magnetoresistive device according to the first exemplary embodiment in the "0" state and a leakage field from a leakage field generation layer, FIG. 4B is a schematic diagram showing the relationship between the rotational direction of a domain wall of the magnetoresistive device according to the first exemplary embodiment in the "1" state and a leakage field from a leakage field generation layer, FIG. 4C is a schematic diagram showing the relationship between the rotational direction of a domain wall of the magnetoresistive device according to the first exemplary embodiment in the "0" state and a leakage field from a leakage field generation layer, and FIG. 4D is a schematic diagram showing the relationship between the rotational direction of a domain wall of the magnetoresistive device according to the first exemplary embodiment in the "1" state and a leakage field from a leakage field generation layer.

FIG. 5A is a schematic diagram showing an operation method when writing "1" to the magnetoresistive device according to the first exemplary embodiment, and FIG. 5B is a schematic diagram showing an operation method when writing "0" to the magnetoresistive device according to the first exemplary embodiment.

FIG. 6A is a schematic diagram showing a method of reading information in the "0" state from the magnetoresistive device according to the first exemplary embodiment, and FIG. 6B is a schematic diagram showing a method of reading information in the "1" state from the magnetoresistive device according to the first exemplary embodiment.

FIG. 9A is a schematic diagram showing the distribution of a local x-direction leakage field used for numerical calculation, and FIG. 9B is a schematic diagram showing the shape of a local pinning potential felt by a domain wall used for numerical calculation.

FIG. 13A is a schematic diagram showing the "0" state of the magnetoresistive device according to the first alternative example of the first exemplary embodiment, FIG. 13B is a schematic diagram showing the "1" state of the magnetoresistive device according to the first alternative example of the first exemplary embodiment, FIG. 13C is a schematic diagram showing the "0" state of the magnetoresistive device according to the first alternative example of the first exemplary embodiment, and FIG. 13D is a schematic diagram showing the "1" state of the magnetoresistive device according to the first alternative example of the first exemplary embodiment.

FIG. 14A is a schematic diagram showing the "0" state of the magnetoresistive device according to the second alternative example of the first exemplary embodiment, and FIG. 14B is a schematic diagram showing the "1" state of the magnetoresistive device according to the second alternative example of the first exemplary embodiment.

FIG. 15A is a schematic diagram showing the "0" state of the magnetoresistive device according to the third alternative example of the first exemplary embodiment, and FIG. 15B is a schematic diagram showing the "1" state of the magnetoresistive device according to the third alternative example of the first exemplary embodiment.

FIG. 16A is a schematic diagram showing the "0" state of the magnetoresistive device according to the fourth alternative example of the first exemplary embodiment, and FIG. 16B is a schematic diagram showing the "1" state of the magnetoresistive device according to the fourth alternative example of the first exemplary embodiment.

FIG. 18A is a schematic diagram showing the "0" state of the magnetoresistive device according to the sixth alternative example of the first exemplary embodiment, and FIG. 18B is a schematic diagram showing the "1" state of the magnetoresistive device according to the sixth alternative example of the first exemplary embodiment.

FIG. 19A is a schematic diagram showing the "0" state of the magnetoresistive device according to the seventh alternative example of the first exemplary embodiment, and FIG. 19B is a schematic diagram showing the "1" state of the magnetoresistive device according to the seventh alternative example of the first exemplary embodiment.

FIG. 20A is a schematic diagram showing the "0" state of the magnetoresistive device according to the eighth alternative example of the first exemplary embodiment, and FIG. 20B is a schematic diagram showing the "1" state of the magnetoresistive device according to the eighth alternative example of the first exemplary embodiment.

FIG. 21A is a schematic diagram showing the "0" state of the magnetoresistive device according to the second exemplary embodiment, and FIG. 21B is a schematic diagram showing the "1" state of the magnetoresistive device according to the second exemplary embodiment.

FIG. 22A is a schematic diagram showing the "0" state of the magnetoresistive device according to the first alternative example of the second exemplary embodiment, and FIG. 22B is a schematic diagram showing the "1" state of the magnetoresistive device according to the first alternative example of the second exemplary embodiment.

DETAILED DESCRIPTION OF THE INVENTION

A magnetoresistive device 100 and a magnetoresistive random access memory (MRAM) 300 according to exemplary embodiments of the present invention are described hereinafter with reference to the attached drawings. The MRAM 300 according to an exemplary embodiment includes a plurality of MRAM cells 200 arranged in an array, and each of the MRAM cells 200 includes the magnetoresistive device 100.

<1. Structure of Magnetoresistive Device>

Figure 1A:
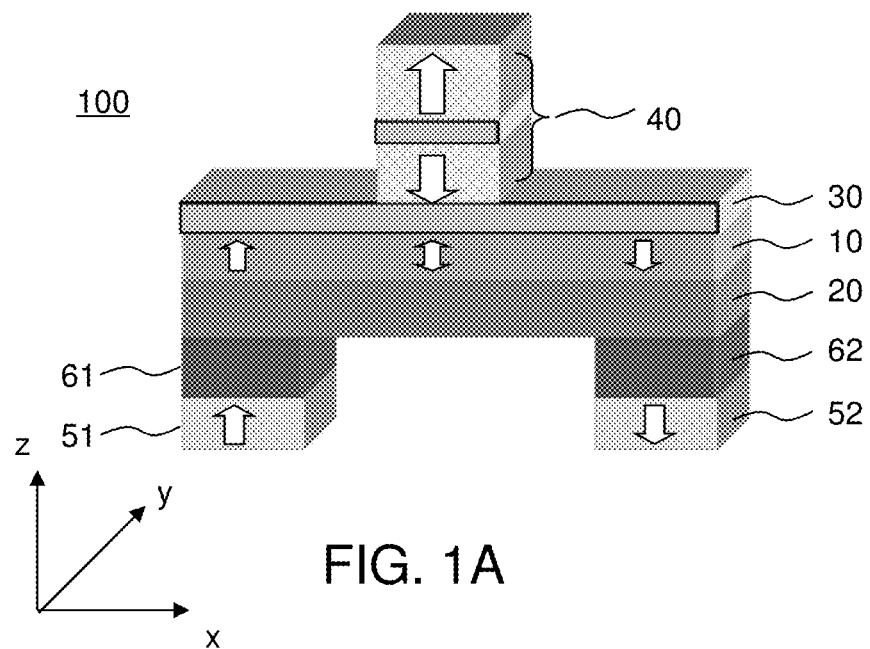
FIGS. 1A and 1B are diagrams illustrating a magnetoresistive device according to a first exemplary embodiment.

FIG. 1A is a schematic diagram showing one example of the structure of the magnetoresistive device 100 according to the first exemplary embodiment. It is assumed that, in the x-y-z coordinate system shown in the figure, the z-axis is perpendicular to a substrate, and the x-y axis is parallel to the substrate surface. This definition of the x-y-z coordinate system is the same for the following figures.

The magnetoresistive device 100 according to the first exemplary embodiment at least includes a magnetic free layer 10, a spin current generation layer 20, a tunnel barrier layer 30, a reference layer 40, and a leakage field generation layer (a first leakage field generation layer 51 and a second leakage field generation layer 52). Further, FIG. 1A shows an example in which the magnetoresistive device 100 further includes a spacer layer (a first spacer layer 61 and a second spacer layer 62).

The magnetic free layer 10, the reference layer 40, and the leakage field generation layer (the first leakage field generation layer 51, the second leakage field generation layer 52) at least partly includes a ferromagnetic material. In FIG. 1A, the magnetization directions of ferromagnetic materials that constitute the magnetic free layer 10, the reference layer 40, and the leakage field generation layer (the first leakage field generation layer 51, the second leakage field generation layer 52) are indicated by arrows. Further, FIG. 1B is a plan view showing the structure of the magnetic free layer 10 viewed from the z-axis, where the magnetization directions are indicated by arrows just like in FIG. 1A.

The magnetic free layer 10 is composed of a ferromagnetic material with a perpendicular magnetic anisotropy. The perpendicular magnetic anisotropy may be derived from a crystalline magnetic anisotropy of crystals or from interfacial magnetic anisotropy generated by interaction with an interface.

Figure 1B:
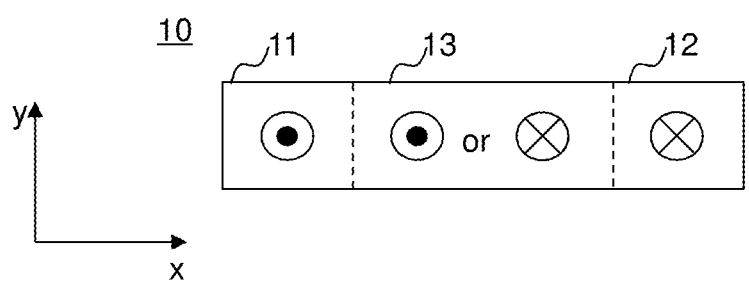

Further, as shown in the plan view of FIG. 1B, the magnetic free layer 10 includes a first magnetization fixed area 11, a second magnetization fixed area 12 and a magnetization free area 13. Note that, in FIG. 1B, the magnetic free layer 10 extends in the x-axis direction, and the magnetization free area 13 is placed between the first magnetization fixed area 11 and the second magnetization fixed area 12. However, the positions of the first magnetization fixed area 11, the second magnetization fixed area 12 and the magnetization free area 13 according to the first exemplary embodiment are not limited thereto.

In the first exemplary embodiment, the first magnetization fixed area 11 and the second magnetization fixed area 12 have a magnetization fixed along the z-axis direction and fixed in the opposite direction to each other. In the example of FIG. 1B, the magnetization of the first magnetization fixed area 11 is fixed to the +z direction, and the magnetization of the second magnetization fixed area 12 is fixed to the −z direction. The magnetization of the magnetization free area 13 can be oriented in any of the +z direction and the −z direction.

When the magnetization in the magnetic free layer 10 is in the magnetization arrangement shown in FIG. 1B, a single domain wall (DW) is formed in the magnetic free layer 10. The domain wall is formed in any of the boundary between the first magnetization fixed area 11 and the magnetization free area 13 and the boundary between the second magnetization fixed area 12 and the magnetization free area 13.

The spin current generation layer 20 is composed of a nonmagnetic conductor. The spin current generation layer 20 is preferably formed from an element with large spin orbit coupling or contain an element with large spin orbit coupling. The spin current generation layer 20 is formed in contact with the magnetic free layer 10. In the example of FIG. 1A, the spin current generation layer 20 is formed to entirely cover the −z side surface of the magnetic free layer 10. However, more generally, the spin current generation layer 20 is not necessarily in contact with one entire surface of the magnetic free layer 10 as long as it is in contact with the magnetization free area 13 in the magnetic free layer 10.

The tunnel barrier layer 30 is composed of a nonmagnetic material. The tunnel barrier layer 30 is placed in contact with the magnetic free layer 10 on the opposite side from the spin current generation layer 20. Preferably, the tunnel barrier layer 30 is formed to entirely cover one surface of the magnetic free layer 10. In the example of FIG. 1A, the tunnel barrier layer 30 is formed to entirely cover the +z side surface of the magnetic free layer 10.

The reference layer 40 is placed in contact with the tunnel barrier layer 30 on the opposite side from the magnetic free layer 10. The reference layer 40 has a perpendicular magnetic anisotropy and includes a ferromagnetic material with a fixed magnetization direction. FIG. 1A shows an example in which the reference layer 40 is an assembly of ferromagnetic material/nonmagnetic material/ferromagnetic material. In the example of FIG. 1A, the two ferromagnetic materials are antiferromagnetically coupled by the nonmagnetic material placed therebetween. Further, the reference layer 40 is placed to overlap at least the magnetization free area 13 in the magnetic free layer 10 on the x-y plane. In the example of FIG. 1A, the reference layer 40 is placed directly above the magnetization free area 13 and within the magnetization free area 13 on the x-y plane. In practice, however, the reference layer 40 may be larger in size than the magnetization free area 13 as long as it at least partly overlaps the magnetization free area 13 on the x-y plane.

In the first exemplary embodiment, the leakage field generation layer (the first leakage field generation layer 51, the second leakage field generation layer 52) at least partly includes a ferromagnetic material with a perpendicular magnetic anisotropy. The first leakage field generation layer 51 is placed above or below the first magnetization fixed area 11 of the magnetic free layer 10. The second leakage field generation layer 52 is placed above or below the second magnetization fixed area 12 of the magnetic free layer 10.

Further, the first leakage field generation layer 51 and the second leakage field generation layer 52 have a fixed magnetization in the opposite direction to each other. In the example of FIG. 1A, the magnetization of the first leakage field generation layer 51 is fixed to the +z direction, and the magnetization of the second leakage field generation layer 52 is fixed to the −z direction.

The first leakage field generation layer 51 and the second leakage field generation layer 52 serve to fix the magnetization of the first magnetization fixed area 11 and the second magnetization fixed area 12 of the magnetic free layer 10 in an opposite direction (antiparallel direction) to each other and fix a domain wall formed in the magnetic free layer 10 by a leakage field generated in those layers.

Further, in the example of FIG. 1A, the first spacer layer 61 and the second spacer layer 62 are placed in addition to the above structure. The first spacer layer 61 is placed between the spin current generation layer 20 and the first leakage field generation layer 51, and the second spacer layer 62 is placed between the spin current generation layer 20 and the second leakage field generation layer 52. The spacer layer (the first spacer layer 61, the second spacer layer 62) is composed of a conductor.

Further, in addition to the above-described layers, the magnetoresistive device 100 preferably includes a contact layer composed of a conductor for connection with external lines, though the illustration of the contact layer is omitted in FIG. 1A.

<2. Memory State of Magnetoresistive Device>

Next, the memory state of the magnetoresistive device 100 according to the first exemplary embodiment is described hereinafter with reference to FIGS. 2A and 2B. As described above, the magnetoresistive device 100 according to the exemplary embodiment at least includes the magnetic free layer 10, the spin current generation layer 20, the tunnel barrier layer 30, the reference layer 40 and the leakage field generation layer (the first leakage field generation layer 51, the second leakage field generation layer 52), and the magnetic free layer 10 at least partly includes a ferromagnetic material. Further, the magnetic free layer 10 is composed of the first magnetization fixed area 11 and the second magnetization fixed area 12 whose magnetization directions are fixed to the opposite direction to each other and the magnetization free area 13 whose magnetization direction is variable. In the magnetoresistive device 100 according to the first exemplary embodiment, the magnetization state of the magnetic free layer 10 is associated with stored information.

Figure 2A:
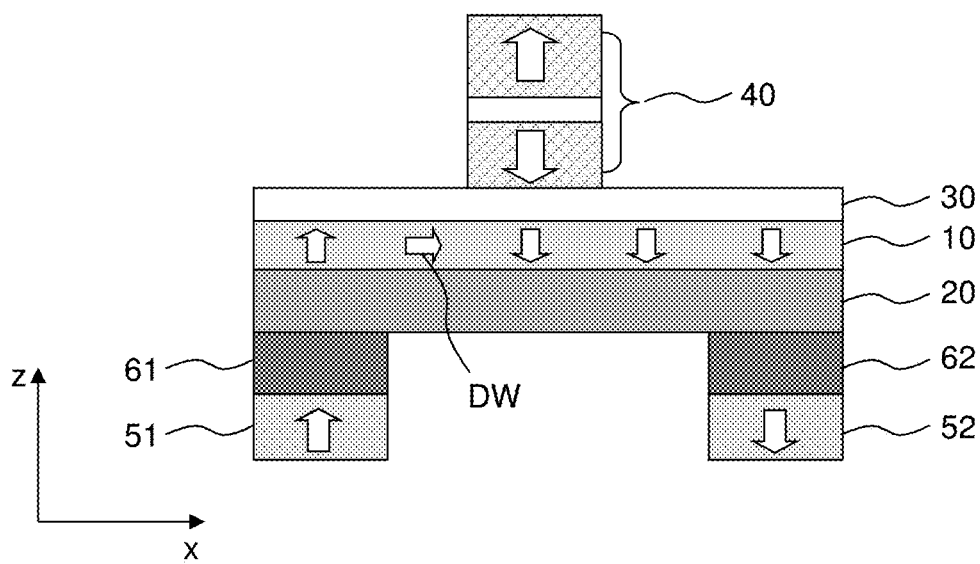
FIGS. 2A and 2B are diagrams illustrating a magnetization structure of the magnetoresistive device according to the first exemplary embodiment.
Figure 2B:
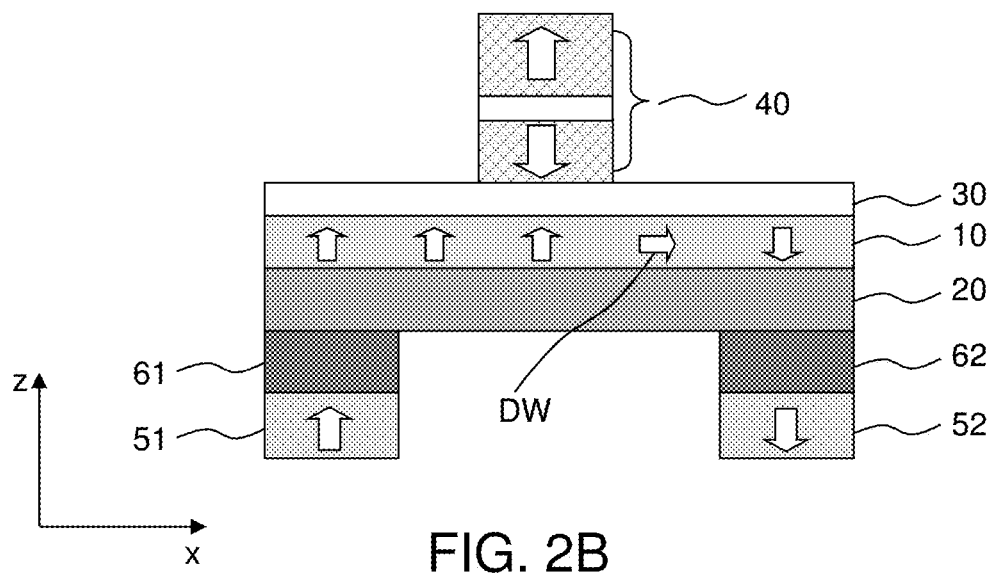

FIGS. 2A and 2B are schematic diagrams showing a magnetization structure in the states where "0" is stored and where "1" is stored, respectively, as memory information in the magnetoresistive device 100 according to the first exemplary embodiment. In the "0" state shown in FIG. 2A, the magnetization of the magnetization free area 13 in the magnetic free layer 10 is oriented in the −z direction. At the same time, the magnetization of the first magnetization fixed area 11 is oriented in the +z direction, and the magnetization of the second magnetization fixed area 12 is oriented in the −z direction. In this state, a domain wall (DW) is formed at the boundary between the magnetization free area 13 and the first magnetization fixed area 11.

On the other hand, in the "1" state shown in FIG. 2B, the magnetization of the magnetization free area 13 in the magnetic free layer 10 is oriented in the +z direction. At the same time, the magnetization of the first magnetization fixed area 11 is oriented in the +z direction, and the magnetization of the second magnetization fixed area 12 is oriented in the −z direction, and therefore a domain wall (DW) is formed at the boundary between the magnetization free area 13 and the second magnetization fixed area 12.

In this manner, in the magnetoresistive device 100 according to the first exemplary embodiment, the magnetization direction of the magnetization free area 13 in the magnetic free layer 10 corresponds to stored information when it is regarded as a memory device; in other words, the position of the domain wall corresponds to the stored information. Note that the definition of the memory state in the magnetoresistive device 100 according to the first exemplary embodiment is not limited thereto, and the association between the magnetization direction of the first magnetization fixed area 11, the second magnetization fixed area 12 and the magnetization free area 13 and the memory state is arbitrary.

Further, in the magnetoresistive device 100 according to the first exemplary embodiment, there is association between the magnetization direction (rotational direction) of the domain wall and the magnetization direction of the leakage field generation layer (the first leakage field generation layer 51, the second leakage field generation layer 52). Those are described hereinafter with reference to FIGS. 3 and 4.

Figure 3A:
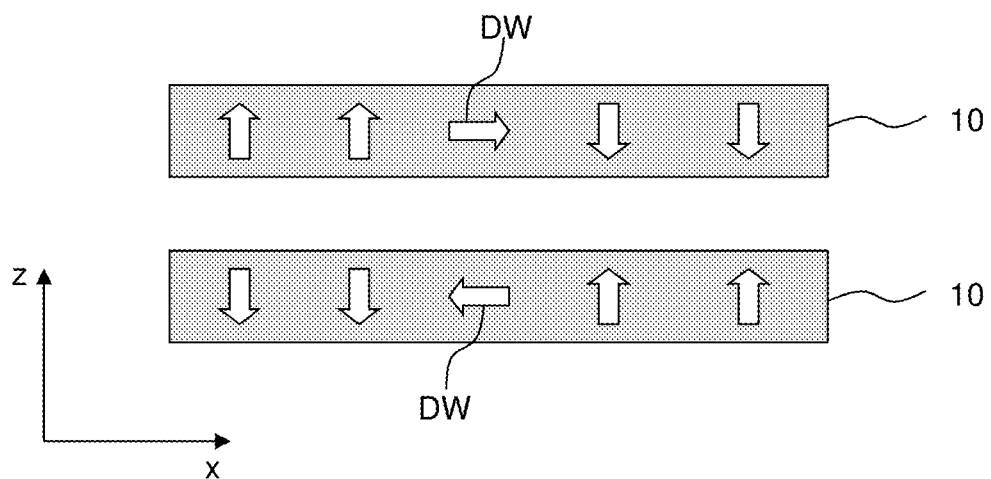
FIGS. 3A and 3B are diagrams illustrating a domain wall formed in the magnetoresistive device according to the first exemplary embodiment.
Figure 3B:
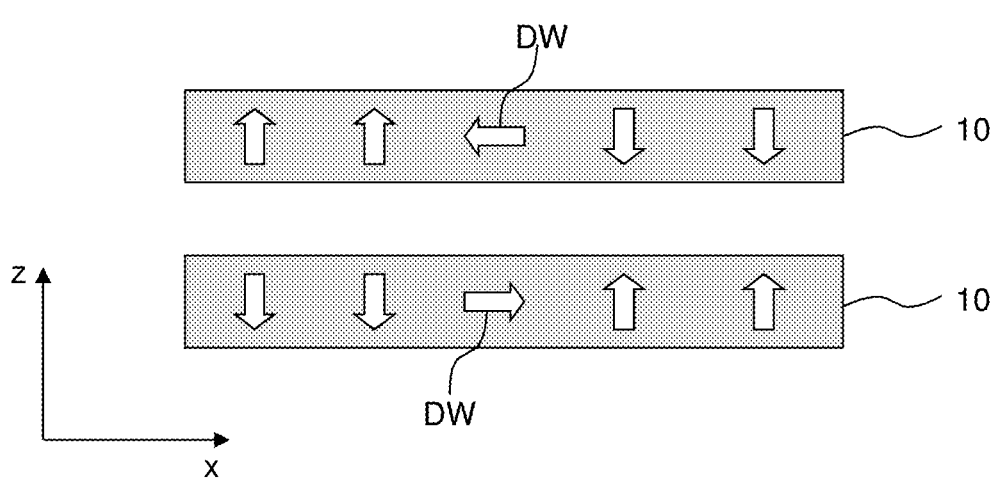

FIGS. 3A and 3B are schematic diagrams showing the rotational direction of a domain wall. First, the rotational direction of the domain wall is described with reference to FIGS. 3A and 3B. It is known that, in an ultrathin ferromagnetic layer which is asymmetric along the lamination direction, the Dzyaloshinskii-Moriya interaction acts, the ferromagnetic layer has a perpendicular magnetic anisotropy, and when a domain wall is formed in the layer, the rotational direction of the magnetization of the domain wall is specified by the Dzyaloshinskii-Moriya interaction. To be specific, the rotational direction of the domain wall changes depending on the sign of the Dzyaloshinskii-Moriya interaction (cf. Non-Patent Literature 4).

FIG. 3A shows a clockwise domain wall. In the clockwise domain wall, the magnetization changes like ↑•→•↓ or ↓•←•↑ from left to right. On the other hand, FIG. 3B shows a counterclockwise domain wall. In the counterclockwise domain wall, the magnetization changes like ↑•←•↓ or ↓•→•↑ from left to right.

Figure 4A:
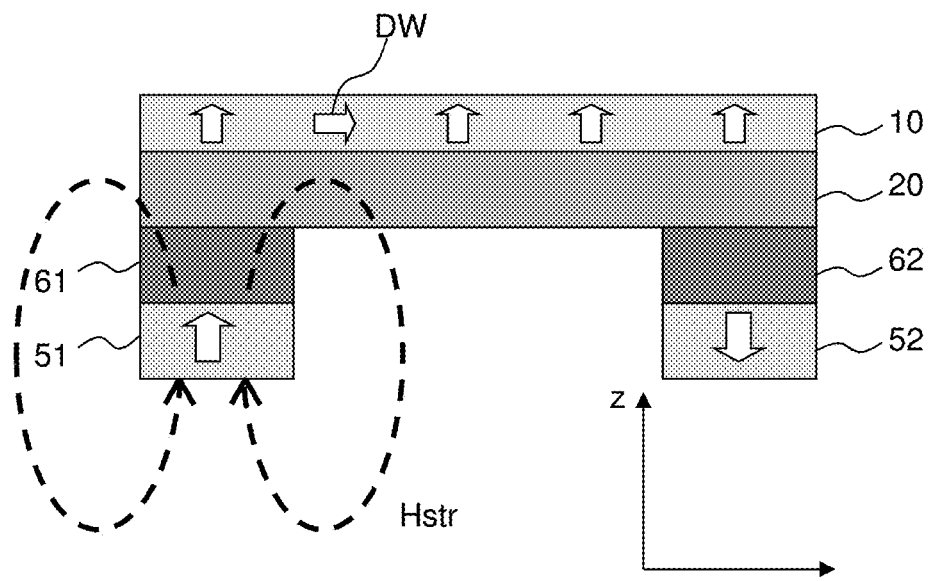
FIGS. 4A to 4D are diagrams illustrating the relationship between a domain wall formed in the magnetoresistive device according to the first exemplary embodiment and a leakage field.
Figure 4B:
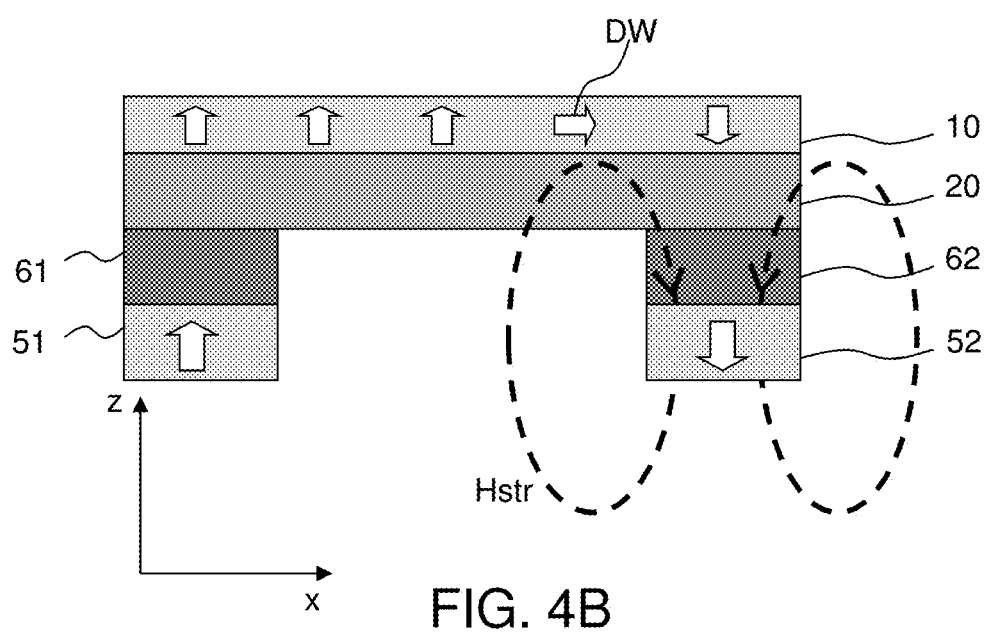

FIGS. 4A to 4D show the relationship with the magnetization direction of the leakage field generation layer (the first leakage field generation layer 51, the second leakage field generation layer 52) when the magnetic free layer 10 has a clockwise domain wall. FIGS. 4A and 4B show the leakage field generation layer (the first leakage field generation layer 51, the second leakage field generation layer 52), the spacer layer (the first spacer layer 61, the second spacer layer 62), the spin current generation layer 20, and the magnetic free layer 10 in the "0" state and the "1" state, respectively.

Further, a leakage field Hstr from the leakage field generation layer (the first leakage field generation layer 51, the second leakage field generation layer 52) is shown by a dotted line. As is apparent from FIG. 4A, in the "0" state, the leakage field Hstr from the first leakage field generation layer 51 having a fixed magnetization in the +z direction has a +x direction component at the position of the domain wall. Further, as is apparent from FIG. 4B, in the "1" state also, the leakage field Hstr from the second leakage field generation layer 52 having a fixed magnetization in the −z direction has a +x direction component at the position of the domain wall. Each of them corresponds to the magnetization direction of the domain wall.

Figure 4C:
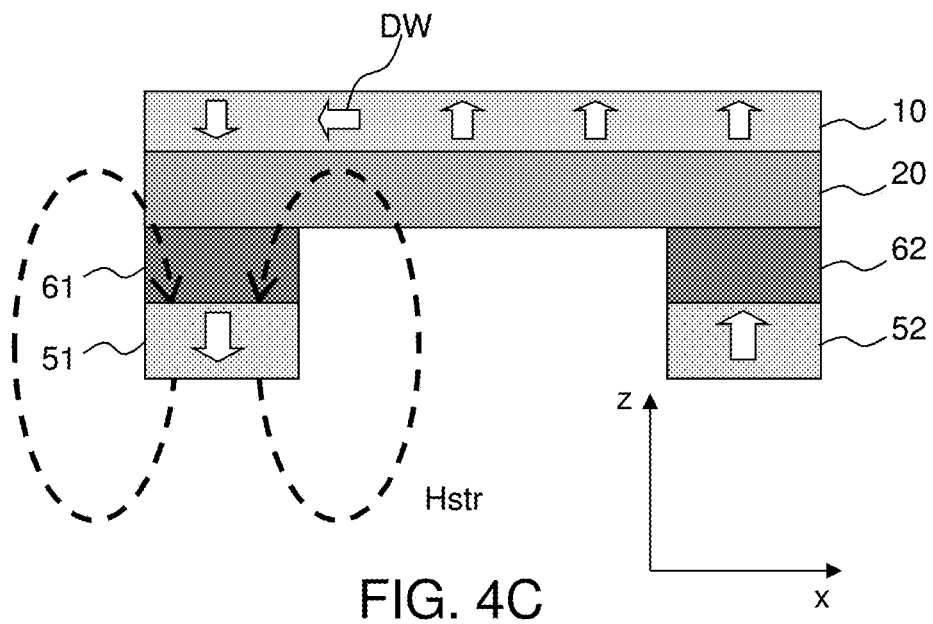
Figure 4D:
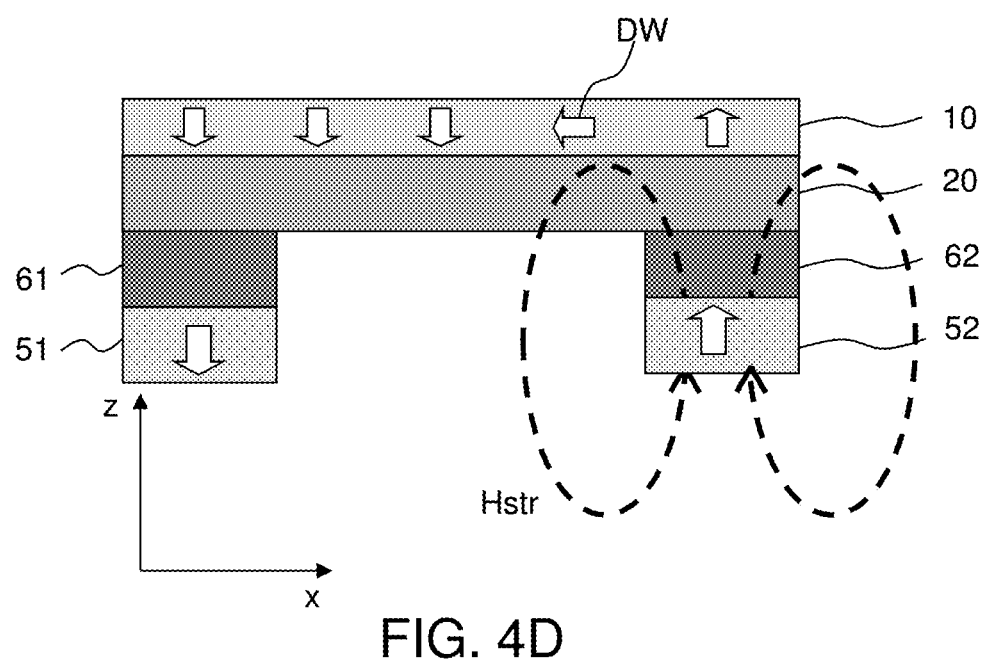

FIGS. 4C and 4D show the magnetization arrangement and the direction of a leakage field in the case where the magnetization of the first leakage field generation layer 51 is fixed to the −z direction, and the magnetization of the second leakage field generation layer 52 is fixed to the +z direction. In this case, the magnetization of the first magnetization fixed area 11 in the magnetic free layer 10 is fixed to the −z direction, and the magnetization of the second magnetization fixed area 12 in the magnetic free layer 10 is fixed to the +z direction. When a domain wall that is preferentially formed by the Dzyaloshinskii-Moriya interaction in the magnetic free layer 10 rotates clockwise, the magnetization of the domain wall is oriented in the −x direction. In this case also, the direction of an x component of the leakage field Hstr generated from the first leakage field generation layer 51 and the second leakage field generation layer 52 at the position of the domain wall coincides with the direction of the magnetization of the domain wall.

As described above, when a domain wall that is preferentially formed in the magnetic free layer 10 has a clockwise rotation, the leakage field generation layer (the first leakage field generation layer 51, the second leakage field generation layer 52) is placed below the magnetic free layer 10, so that the magnetization of the domain wall and the in-plane component of the leakage field Hstr generated from the leakage field generation layer (the first leakage field generation layer 51, the second leakage field generation layer 52) coincide with each other. Note that an exemplary embodiment in the case where a domain wall formed in the magnetic free layer 10 has a counterclockwise rotation is described later as a first alternative example.

The case where the rotation of a domain wall formed in the magnetic free layer 10 is determined by the Dzyaloshinskii-Moriya interaction is described above; however, a mechanism of a domain wall for fixing in-plane magnetization is not limited thereto in practice. For example, the present invention can be implemented as long as the magnetic free layer 10 is designed for having a one-way in-plane anisotropy. Further, if the width of the magnetic free layer 10 in the y direction is sufficiently narrower than the domain wall width, a Neel wall is formed preferentially and stably, and the present invention can be implemented in this case as well. In other words, in the basic sense, the above-described effects can be obtained by any effect as long as a domain wall formed in the magnetic free layer 10 is designed to preferentially have an in-plane magnetization.

<3. Method for Writing Information to Magnetoresistive Device>

A method for writing information to the magnetoresistive device 100 according to the first exemplary embodiment is described hereinafter with reference to FIGS. 5A and 5B. As described above, in the magnetoresistive device 100 according to the first exemplary embodiment, the position of a domain wall corresponds to stored information. In the magnetoresistive device 100 according to the first exemplary embodiment, information is written by moving the domain wall with an electric current. A mechanism for moving a domain wall is not particularly limited, and the case of driving a domain wall by the spin Hall effect and the Dzyaloshinskii-Moriya interaction is described hereinafter as one example.

When an electric current in the x (±x) direction is introduced into the spin current generation layer 20, a spin current is generated in the z direction by the spin Hall effect, and electrons with spin polarization along the +y or −y direction flow into the magnetic free layer 10. The electrons with spin polarization interact with the magnetization of a domain wall.

According to Non-Patent Literature 4, when the +y or −y direction conduction electrons flow into a domain wall whose rotational direction is specified in the +x or −x direction by the Dzyaloshinskii-Moriya interaction, a domain wall moves in the same direction as or in the opposite direction to the current flowing through the spin current generation layer 20. The moving direction of the domain wall is determined by the sign of the Dzyaloshinskii-Moriya interaction and the sign of the spin Hall effect.

Hereinafter, the operation of writing "1" and the operation of writing "0" are described using an example in which a domain wall moves along the path of a current.

Figure 5A:
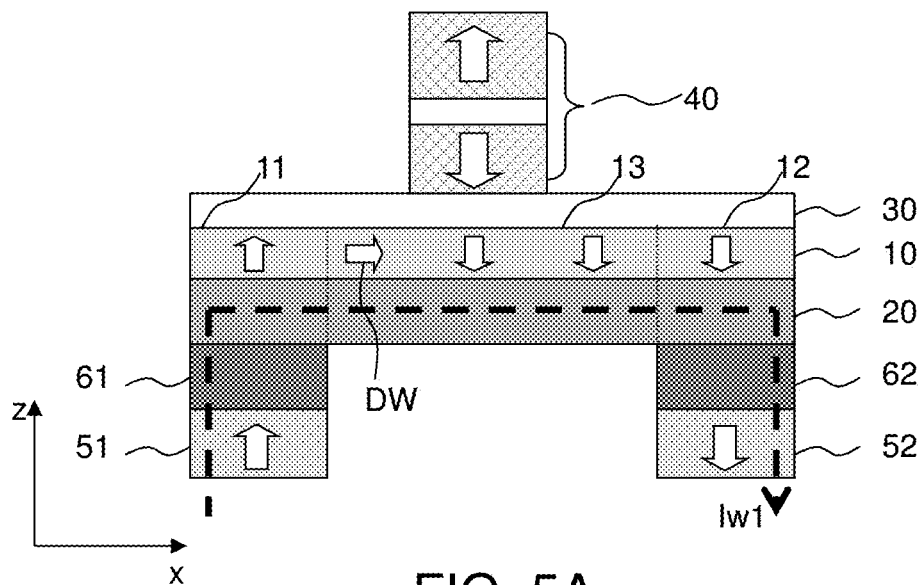
FIGS. 5A and 5B are diagrams illustrating a write operation to the magnetoresistive device according to the first exemplary embodiment.
Figure 5B:
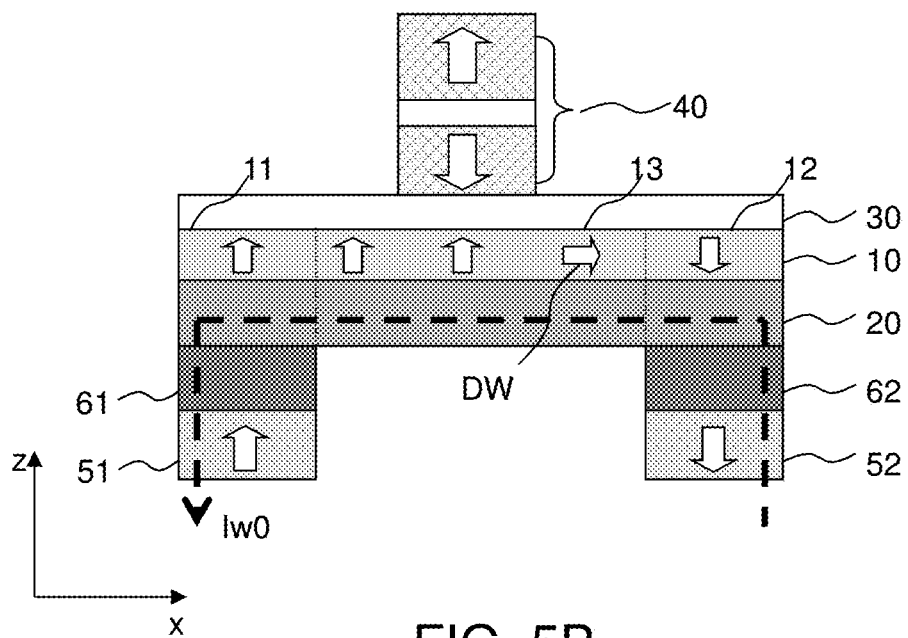

FIGS. 5A and 5B are schematic diagrams showing an operation method when writing "1" and when writing "0", respectively, as memory information in the magnetoresistive device 100 according to the first exemplary embodiment.

In the operation of writing "1" shown in FIG. 5A, a "1" write current Iw1 flows in the +x direction in the spin current generation layer 20. At the same time, a spin current is generated in the z direction in the spin current generation layer 20, and electrons with spin polarization along the y direction flow into the magnetic free layer 10. Spin transfer torque thereby acts on a domain wall formed at the boundary between the magnetization free area 13 and the first magnetization fixed area 11. The spin transfer torque is a phenomenon in which spin angular momentum transfers from electrons with spin polarization to a domain wall. Thus, the domain wall on which the spin transfer torque acts moves in the magnetization free area 13 and changes the magnetization direction of the magnetization free area 13 as a result.

For the case of the example shown in FIG. 5A, the magnetization in magnetic domain wall (DW) is initially pointing the +x direction. Electrons polarizing to +y direction flows into the domain wall, which gives rise to a torque and rotates the magnetization of the domain wall to the +y direction. Then, due to the magnetic anisotropy field of the domain wall, the magnetization rotates to the +z direction, and as a result, the domain wall moves to the +x direction. In such a way, the domain wall displaces from the boundary between the first magnetization fixed area 11 and the magnetization free area 13 to the boundary between the magnetization free area 13 and the second magnetization fixed area 12.

The domain wall stops at the boundary between the magnetization free area 13 and the second magnetization fixed area 12 because the magnetization of the second magnetization fixed area 12 is fixed by a leakage field from the second leakage field generation layer 52. The magnetization state achieved thereby is the "1" state shown in FIG. 2B. Thus, by introducing the "1" write current Iw1 into the magnetoresistive device 100, it is possible to rewrite the "0" state in stored information to the "1" state.

On the other hand, in the operation of writing "0" shown in FIG. 5B, a "0" write current Iw0 flows in the −x direction in the spin current generation layer 20. At the same time, a spin current is generated in the +z direction in the spin current generation layer 20, and electrons with spin polarization along the −y direction flow into the magnetic free layer 10. Spin transfer torque thereby acts on a domain wall formed at the boundary between the magnetization free area 13 and the second magnetization fixed area 12. The moving direction of the domain wall on which the spin transfer torque acts can be represented by torque from electrons with spin polarization along the −y direction to the domain wall oriented in the +x direction. In this case, the domain wall on which the spin transfer torque acts turns to the −z direction. Then, because a magnetization is stabilized when it is oriented in the same direction as an adjacent magnetization, a magnetization that is in contact with the magnetization that has turned to the −z direction by the spin transfer torque also turns to the −z direction in the magnetization free area 13. Then, a domain wall is formed at the boundary between the magnetization free area 13 and the first magnetization fixed area 11. Accordingly, the domain wall moves from the boundary between the magnetization free area 13 and the second magnetization fixed area 12 to the boundary between the magnetization free area 13 and the first magnetization fixed area 11.

The domain wall stops at the boundary between the magnetization free area 13 and the first magnetization fixed area 11 because the magnetization of the first magnetization fixed area 11 is fixed by a leakage field from the first leakage field generation layer 51. The magnetization state achieved thereby is the "0" state shown in FIG. 2A. Thus, by introducing the "0" write current Iw0 into the magnetoresistive device 100, it is possible to rewrite stored information from the "1" state to the "0" state.

As described above, by introducing a bidirectional write current into the magnetic free layer 10, it is possible to rewrite stored information between the "0" state and the "1" state. Note that, although FIGS. 5A and 5B show the cases where each of the write currents Iw1 and Iw0 flows through the first leakage field generation layer 51, the first spacer layer 61, the second spacer layer 62 and the second leakage field generation layer 52, the path of the write current is not limited thereto. The write current may flow through any path as long as it flows through the spin current generation layer 20.

In the case where the "0" write current Iw0 is introduced in the "0" state and where the "1" write current Iw1 is introduced in the "1" state, no change occurs in the memory state. Thus, it is also possible to overwrite information in the magnetoresistive device 100 according to the first exemplary embodiment.

<4. Method for Reading Information from Magnetoresistive Device>

A method for reading information from the magnetoresistive device 100 according to the first exemplary embodiment is described hereinafter with reference to FIGS. 6A and 6B. As described above, in the magnetoresistive device 100 according to the first exemplary embodiment, the magnetization direction of the magnetization free area 13 in the magnetic free layer 10 corresponds to stored information. In the magnetoresistive device 100 according to the first exemplary embodiment, information is read using the tunnel magnetoresistance effect that is generated by the relative angle of magnetization between the magnetization free area 13 and the reference layer 40.

Figure 6A:
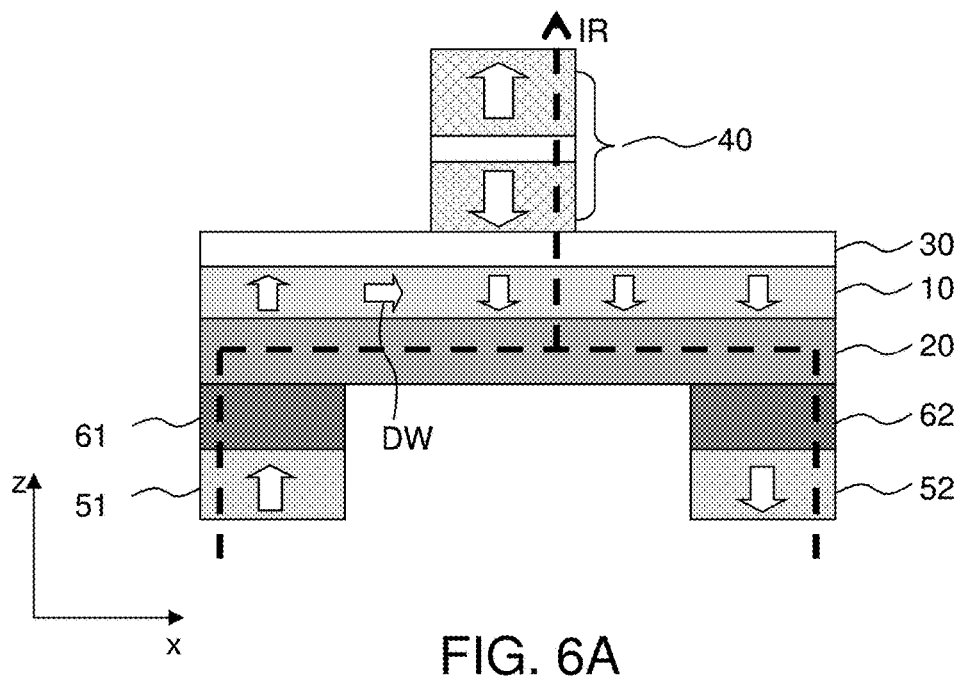
FIGS. 6A and 6B are diagrams illustrating a read operation from the magnetoresistive device according to the first exemplary embodiment.
Figure 6B:
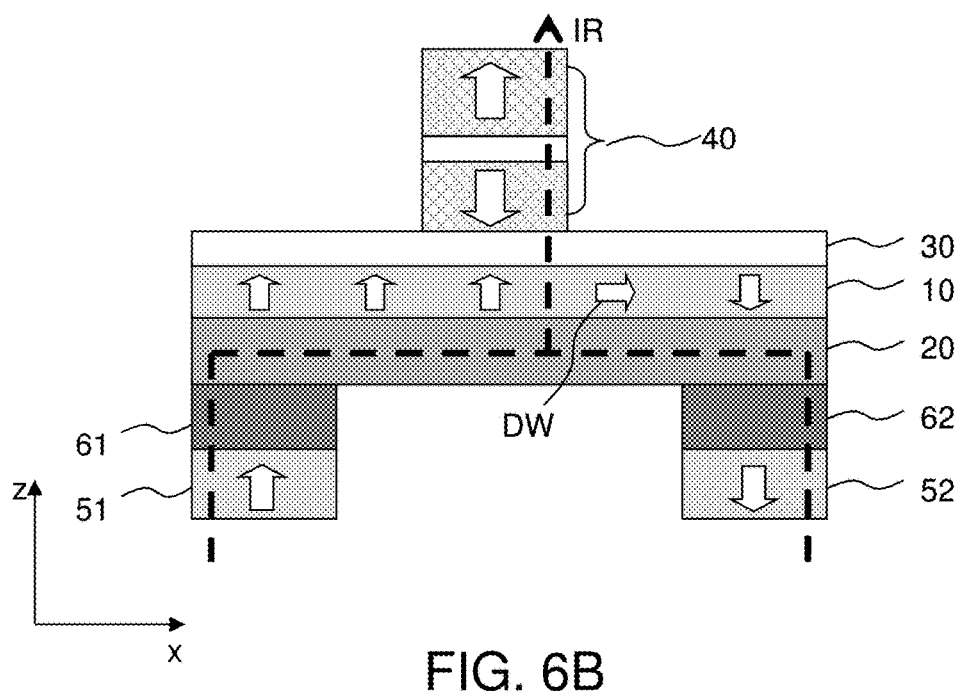

FIGS. 6A and 6B show schematic diagrams of an operation method for reading "0" and reading "1", respectively, as memory information in the magnetoresistive device 100 according to the first exemplary embodiment. In any case, a read current IR is introduced to pass through the reference layer 40, the tunnel barrier layer 30 and the magnetic free layer 10.

The memory information is determined as the "0" state or the "1" state based on the level of tunnel magnetoresistance caused by the tunnel magnetoresistance effect when introducing an electric current. The tunnel magnetoresistance effect is a phenomenon in which, when introducing an electric current into an element composed of ferromagnetic layer 1/insulating layer/ferromagnetic material 2, for example, electric resistance changes depending on the relative angle between the magnetization of the ferromagnetic layer 1 and the magnetization of the ferromagnetic layer 2. The tunnel magnetoresistance is the smallest when the relative angle between the ferromagnetic layer 1 and the ferromagnetic layer 2 is 0°, and it is the greatest when the relative angle between the ferromagnetic layer 1 and the ferromagnetic layer 2 is 180°. The same applies to the magnetoresistive device according to the first exemplary embodiment.

In the case of reading "0" shown in FIG. 6A, the magnetization of a ferromagnetic layer in the reference layer 40 which is in contact with the nonmagnetic layer 20 is oriented in the −z direction, and the magnetization of the magnetization free area 13 in the magnetic free layer 10 is also oriented in the −z direction. The relative angle between the two magnetizations is 0° in this case. Thus, when an electric current is introduced in the direction to pass through the reference layer 40, the tunnel barrier layer 30 and the magnetic free layer 10, a low-resistance state is observed due to the tunnel magnetoresistance effect.

On the other hand, in the case of reading "1" shown in FIG. 6B, the magnetization of a ferromagnetic layer in the reference layer 40 which is in contact with the tunnel barrier layer 30 is oriented in the −z direction, and the magnetization of the magnetization free area 13 in the magnetic free layer 10 is oriented in the +z direction. The relative angle between the two magnetizations is 180° in this case. Thus, when an electric current is introduced in the direction to pass through the reference layer 40, the tunnel barrier layer 30 and the magnetic free layer 10, a high-resistance state is observed due to the tunnel magnetoresistance effect.

As described above, because resistance in the magnetoresistive device 100 varies depending on the relative angle between the magnetization of the magnetization free area 13 and the magnetization of the reference layer 40, it is possible to read information from the magnetoresistive device 100 by using such a difference in resistance.

Note that, although FIGS. 4A to 4D show the casea where the read current IR is introduced through the path of the leakage field generation layer (the first leakage field generation layer 51, and the second leakage field generation layer 52), the spacer layer (the first spacer layer 61, and the second spacer layer 62), the spin current generation layer 20, the magnetic free layer 10, the tunnel barrier layer 30 and the reference layer 40, the path of the read current IR is not limited thereto as is apparent from the above description. The path is not limited thereto as long as an electric current flows in the direction of passing through the reference layer 40, the tunnel barrier layer 30 and the magnetization free area 13 in the magnetic free layer 10.

<5. Circuit Structure of Magnetoresistive Random Access Memory>

A circuit structure and a circuit operation method of the MRAM 300 according to the first exemplary embodiment are described hereinafter with reference to FIGS. 7 and 8. Note that the circuit structure described below is one example for forming the MRAM 300 using the magnetoresistive device 100 according to the exemplary embodiment, and MRAM having the same effects as in the exemplary embodiment can be provided by use of another circuit structure as well.

As described earlier, the MRAM 300 according to the first exemplary embodiment includes a plurality of MRAM cells 200 arranged in an array, and each MRAM cell 200 has the magnetoresistive device 100.

Figure 7:
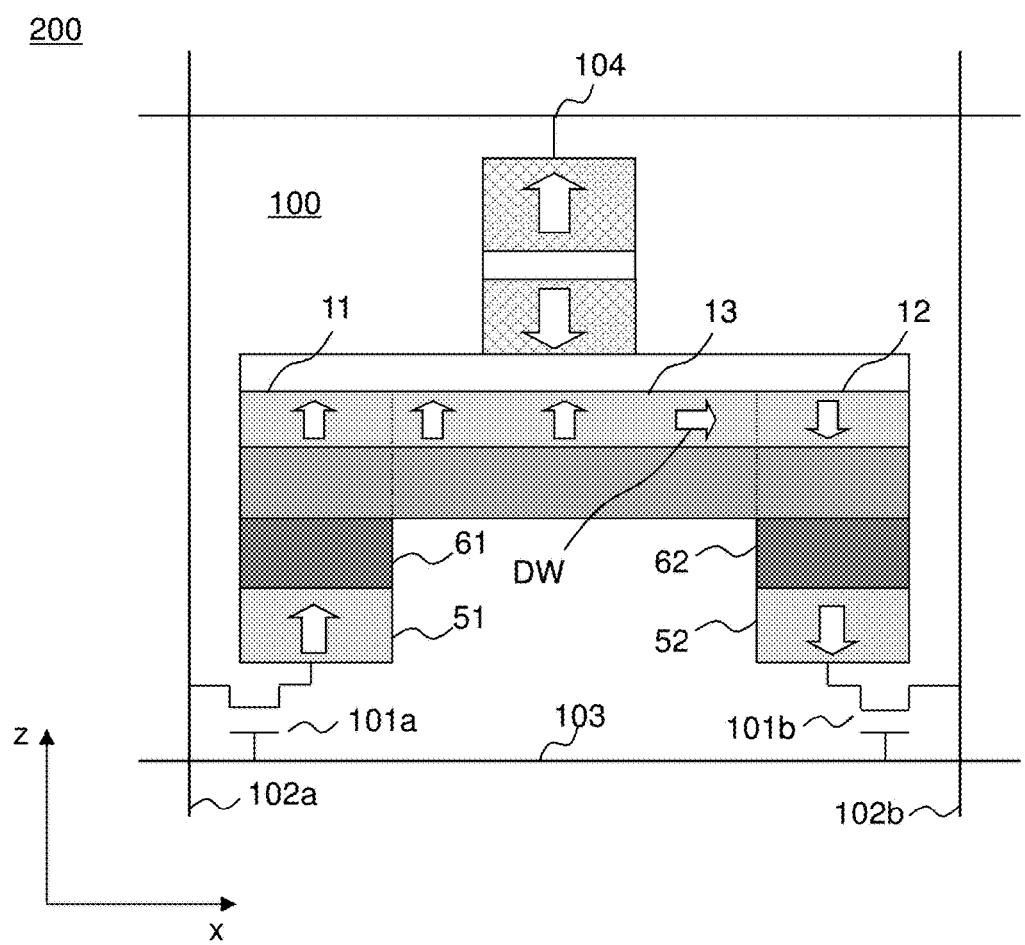
FIG. 7 is a cell circuit diagram of an MRAM cell according to the first exemplary embodiment.

FIG. 7 is a schematic diagram showing one example of the circuit structure of one MRAM cell 200 that constitutes the MRAM 300 according to the first exemplary embodiment. In this MRAM cell 200, the magnetoresistive device 100 is connected to a first bit line 102a, a second bit line 102b, a word line 103, and a ground line 104. A terminal connected to the reference layer 40 is connected to the ground line 104.

The first magnetization fixed area 11 is connected to the source/drain of a first cell transistor 101a through the first spacer layer 61 and the first leakage field generation layer 51. The second magnetization fixed area 12 is connected to the source/drain of a second cell transistor 101b through the second spacer layer 62 and the second leakage field generation layer 52. The gate electrodes of the first cell transistor 101a and the second cell transistor 101b are connected to the word line 103.

Further, the source/drain terminals of the first cell transistor 101a and the second cell transistor 101b that are opposite to those connected to the magnetoresistive device 100 are connected to the first bit line 102a and the second bit line 102b, respectively.

When writing information, the word line 103 is set to High level, and thereby the first cell transistor 101a and the second cell transistor 101b turn ON. Then, by setting either one of the first bit line 102a or the second bit line 102b to High, writing of information to the magnetoresistive device 100 is enabled.

When reading information, the word line 103 is set to High level, and thereby the first cell transistor 101a and the second cell transistor 101b turn ON. Then, by setting both the first bit line 102a and the second bit line 102b to High or by setting one line to High and the other line to Open, reading of information from the magnetoresistive device 100 is enabled.

Figure 8:
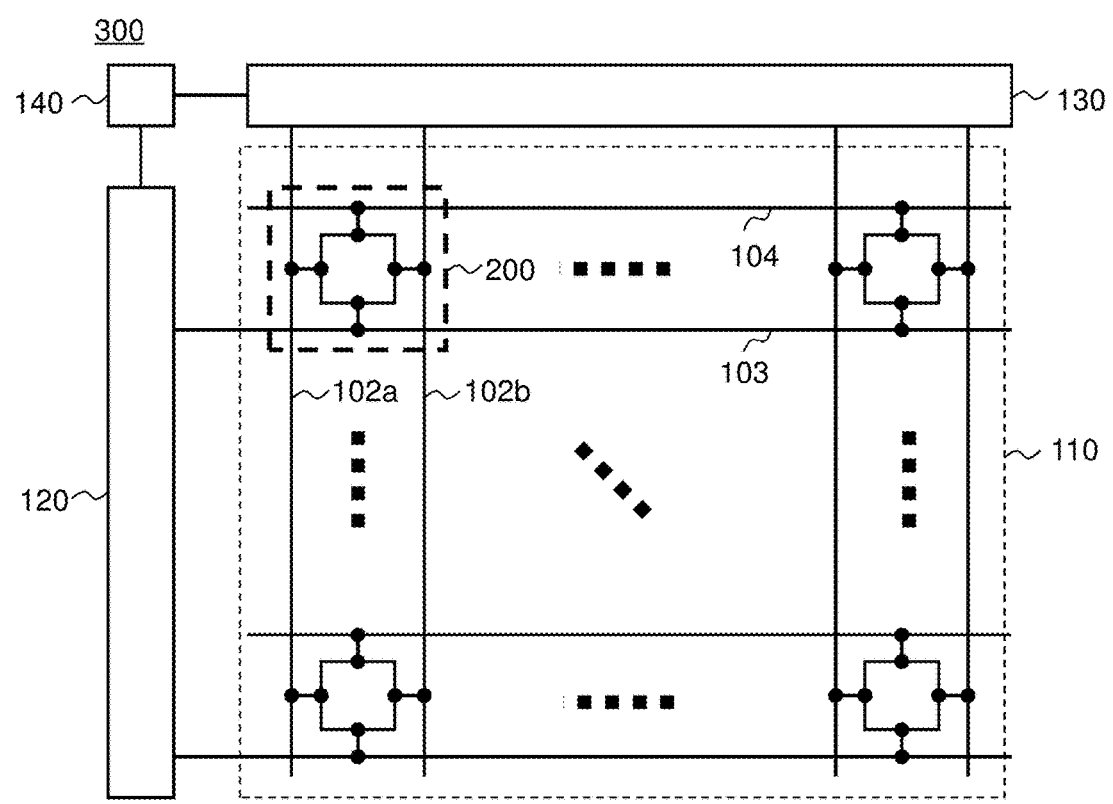
FIG. 8 is a circuit block diagram of MRAM according to the first exemplary embodiment.

FIG. 8 is a schematic view of one example of a circuit block showing the structure of the MRAM 300 according to the first exemplary embodiment. The MRAM 300 includes a memory cell array 110, an X driver 120, a Y driver 130, and a controller 140. The memory cell array 110 includes a plurality of MRAM cells 200 arranged in an array. Each of the MRAM cells 200 is connected to the first bit line 102a, the second bit line 102b, the word line 103, and the ground line 104. The X driver 120 is connected to a plurality of word lines 103, and drives the word line 103 that is connected to the MRAM cell 200 to be accessed among the plurality of word lines 103.

The Y driver 130 is connected to a plurality of first bit lines 102a and a plurality of second bit lines 102b, and sets the plurality of first bit lines 102a and the plurality of second bit lines 102b to a desired data writing or reading state.

The controller 140 controls each of the X driver 120 and the Y driver 130 in accordance with data writing or data reading. Note that, although the ground line 104 that is connected to the reference layer 40 of the magnetoresistive device 100 is connected to the X driver 120, a read bit line connected to the Y driver 130 may be used in place of it.

<6. Material and Thickness>

Hereinafter, materials that can be used for the magnetoresistive device 100 according to the first exemplary embodiment and their suitable thickness are described. It is preferred that the material of the magnetic free layer 10 contains at least one 3e ferromagnetic transition metal element such as Fe, Co or Ni (note that, however, Mn—Al, Mn—Ga or the like is also suitable as the material of the magnetic free layer 10 though not containing any 3e ferromagnetic transition metal element). Further, the magnetic free layer 10 has a perpendicular magnetic anisotropy as described earlier. The perpendicular magnetic anisotropy may be derived from crystalline magnetic anisotropy or interfacial magnetic anisotropy. When using the crystalline magnetic anisotropy, an alloy material such as Fe—Pt, Co—Pt, Fe—Pd, Fe—Ni, Sm—Co or Co—Cr—Pt, a layer-by-layer assembled film such as Co/Pt, Co/Pd, Co/Ni or Fe/Au or the like may be used.

On the other hand, when using the interfacial magnetic anisotropy, various materials containing Fe, Co or Ni may be used. Specific examples are Fe—Co, Fe—Co—Ni, Co—Ni and the like. Further, an element such as B, C, N, O, F, Si, Al, P or S may be added thereto. For example, Co—Fe—B may be used.

The thickness of the magnetic free layer 10 is preferably thin in order to enhance the effect of the Dzyaloshinskii-Moriya interaction and to effectively move a domain wall with a small electric current. Because the lower limit of the thickness is one atomic layer, it is approximately 0.2 nm. While the upper limit of the thickness is arbitrary, it is preferably 5 nm or less, or more preferably 2 nm or less. Particularly, when using the interfacial magnetic anisotropy, the upper limit of the thickness is set in view of the level of the interfacial magnetic anisotropy and saturation magnetization.

The spin current generation layer 20 is composed of a nonmagnetic conductor. Preferably, it is composed of an element with large spin orbit coupling or composed of a material containing an element with large spin orbit coupling. To be specific, W, Ta, Hf, Re, Os, Ir, Pt, Bi or the like may be used for example. Further, it is possible to control the level and sign of the spin Hall effect and the Dzyaloshinskii-Moriya interaction by adding another element to the above element. An element to be added may be B, O, N, C, Al, Si, P or the like. Further, by using a light element such as Cu or Al as a metal matrix, such a heavy element may be doped.

The lower limit of the thickness of the spin current generation layer 20 is set as the lower limit of the thickness at which the spin Hall effect appears. Generally, the lower limit of the thickness at which the spin Hall effect appears is about two atomic layers, which is approximately 0.2 nm.

The upper limit of the thickness of the spin current generation layer 20 is based on the spin diffusion length of a material. This varies largely from material to material, and it is about several nm for a heavy element such as Ta, W or Pt. On the other hand, it is several 100 nm for Cu or the like. Note that, however, because a write current increases if the spin current generation layer 20 is too thick, the thickness is preferably designed in view of a write current. The upper limit of the thickness of the spin current generation layer 20 is preferably 10 nm and more preferably 5 nm.

The tunnel barrier layer 30 is composed of an insulating material that contains one of N, O and C. Specific examples include Mg—O, Al—O, Si—O, Si—N, Si—C—N, Mg—N, Al—N, Zn—O and Zn—N. The thickness of the tunnel barrier layer 30 is designed to obtain desired reading characteristics. To be specific, a thickness of about 0.5 nm to 2 nm may be used.

For the reference layer 40, various ferromagnetic materials having a perpendicular magnetic anisotropy may be used. Thus, it is preferred to contain any element of Fe, Co and Ni (note that, however, Mn—Al, Mn—Ga or the like may be also used as the reference layer 40 though not containing any ferromagnetic material). Specific materials that can be used are the same as those of the magnetic free layer 10 and thus not redundantly described.

Further, the reference layer 40 may be an assembly of different ferromagnetic layers and a nonmagnetic layer. In the above-described examples, the reference layer 40 has a structure in which a ferromagnetic material, a nonmagnetic material and a ferromagnetic material are sequentially assembled, and the magnetizations of the two ferromagnetic materials are fixed in the opposite direction to each other. Further, for a layer in the reference layer 40 which is in contact with the tunnel barrier layer 30, a material with high spin polarization for obtaining a high tunnel magnetoresistance effect ratio or a material by which a high tunnel magnetoresistance effect ratio can be obtained when combined with the tunnel barrier layer 30 is preferred to be used. In light of the above, examples of the assembled structure used for the reference layer 40 are Co—Fe—B/[Co/Pt] assembled film and Ru/[Co/Pt] assembled film sequentially from the tunnel barrier layer 30 side.

The thickness of the reference layer 40 is designed arbitrarily. Note that, however, a leakage field generated in the reference layer 40 is preferably small at the height of the magnetic free layer 10. Thus, the assembled structure of the reference layer 40 is preferably designed so that a leakage field is small at the height of the magnetic free layer 10.

In the first exemplary embodiment, for the leakage field generation layer (the first leakage field generation layer 51, the second leakage field generation layer 52), various ferromagnetic materials having a perpendicular magnetic anisotropy may be used. Thus, it is preferred to contain any element of Fe, Co and Ni (note that, however, Mn—Al, Mn—Ga or the like may be also used as the leakage field generation layer though not containing any ferromagnetic material). Specific materials that can be used are the same as those of the magnetic free layer 10 and thus not redundantly described. Further, for the leakage field generation layer (the first leakage field generation layer 51, the second leakage field generation layer 52), it is preferred to use a material with large saturation magnetization in order to generate a large leakage field. Specific examples are Fe—Pt, Co/Pt, Co—Fe/Pt and the like.

The thickness of the leakage field generation layer (the first leakage field generation layer 51, the second leakage field generation layer 52) can be designed arbitrarily. For example, the thickness of the leakage field generation layer is set to the range of 1 nm to 30 nm. Note that, because the magnetization needs to be in the opposite direction between the first leakage field generation layer 51 and the second leakage field generation layer 52 in the leakage field generation layer, it is preferred to differentiate the magnetic properties between the first leakage field generation layer 51 and the second leakage field generation layer 52. This can be achieved by differentiating a material, a structure, a thickness, a manufacturing method and the like between them.

For the spacer layer (the first spacer layer 61, the second spacer layer 62), any conductive material may be used. To be specific, Ta, W, Au, Ag, Cu, Ti, V, Cr, Al or the like may be used.

The thickness of the spacer layer is designed to optimize a leakage field level from the leakage field generation layer (the first leakage field generation layer 51, the second leakage field generation layer 52) at the position of the magnetic free layer 10. A preferred range of the thickness of the spacer layer is described later.

<7. Principle>

The principle of the magnetoresistive device 100 according to the first exemplary embodiment is described hereinafter with reference to the calculation results shown in FIGS. 9 to 12. The inventors of the exemplary embodiment have numerically calculated the dynamics of a domain wall whose rotational direction is specified by the Dzyaloshinskii-Moriya interaction, which is a domain wall when driven by a spin current from the adjacent spin current generation layer 20, in the magnetic free layer 10 by the Landau-Lifshitz-Gilbert equation using collective coordinates (cf. Non-Patent Literature 4). Further, as collective coordinates describing the state of the domain wall, q indicating the position of the domain wall and φ indicating the angle of the magnetization of the domain wall are used. φ is 0 when the magnetization is oriented in-plane.

Figure 9A:
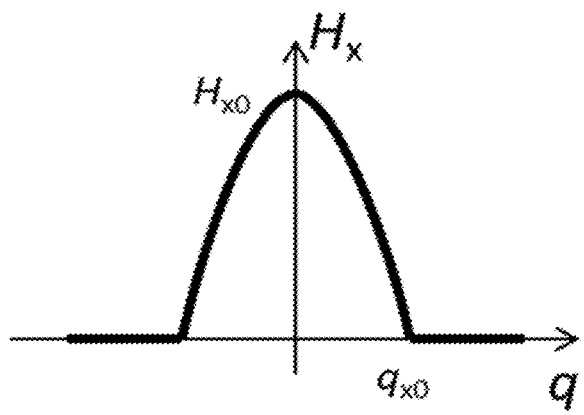
FIGS. 9A and 9B are diagrams illustrating parameters used for numerical calculation.
Figure 9B:
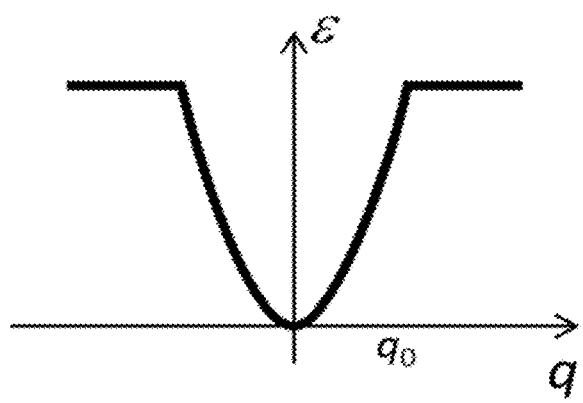

When the domain wall whose rotational direction is specified by the Dzyaloshinskii-Moriya interaction is driven by a spin current from the adjacent spin current generation layer 20, if there is no mechanism for constraining the domain wall in the wire, there is no threshold current for driving the domain wall. Thus, the inventors of the present invention have taken two constraint mechanisms of a domain wall into calculation. They are shown in FIGS. 9A and 9B. The first case is when there is a local x-direction magnetic field as shown in FIG. 9A (in-plane magnetization). It is assumed that the local x-direction magnetic field is in the form of a quadratic function. To be specific, the x-direction magnetic field is given by the following Equation 1 in the range of $-qx0$ to $+qx0$.

$$H_x(q) = H_{x0}\left(\frac{q}{q_{x0}}\right)^2 + H_{x0} \quad \text{(Equation 1)}$$

In the above Equation, q indicates the position of the domain wall in the x direction, and a function where $H_x(q)=0$ is assumed outside the range of $-q_{x0}$ to $+q_{x0}$. The second case is when energy c per unit area felt by the domain wall is given in the form of a quadratic function, and it is given by the following Equation 2 in the range of $-q_0$ to $+q_0$.

$$\varepsilon(q) = MH_{c0q0}\left(\frac{q}{q_0}\right)^2 \quad \text{(Equation 2)}$$

A function where $MH_{c0q0}$ is assumed outside the range of $-q_0$ to $+q_0$.

Figure 10:
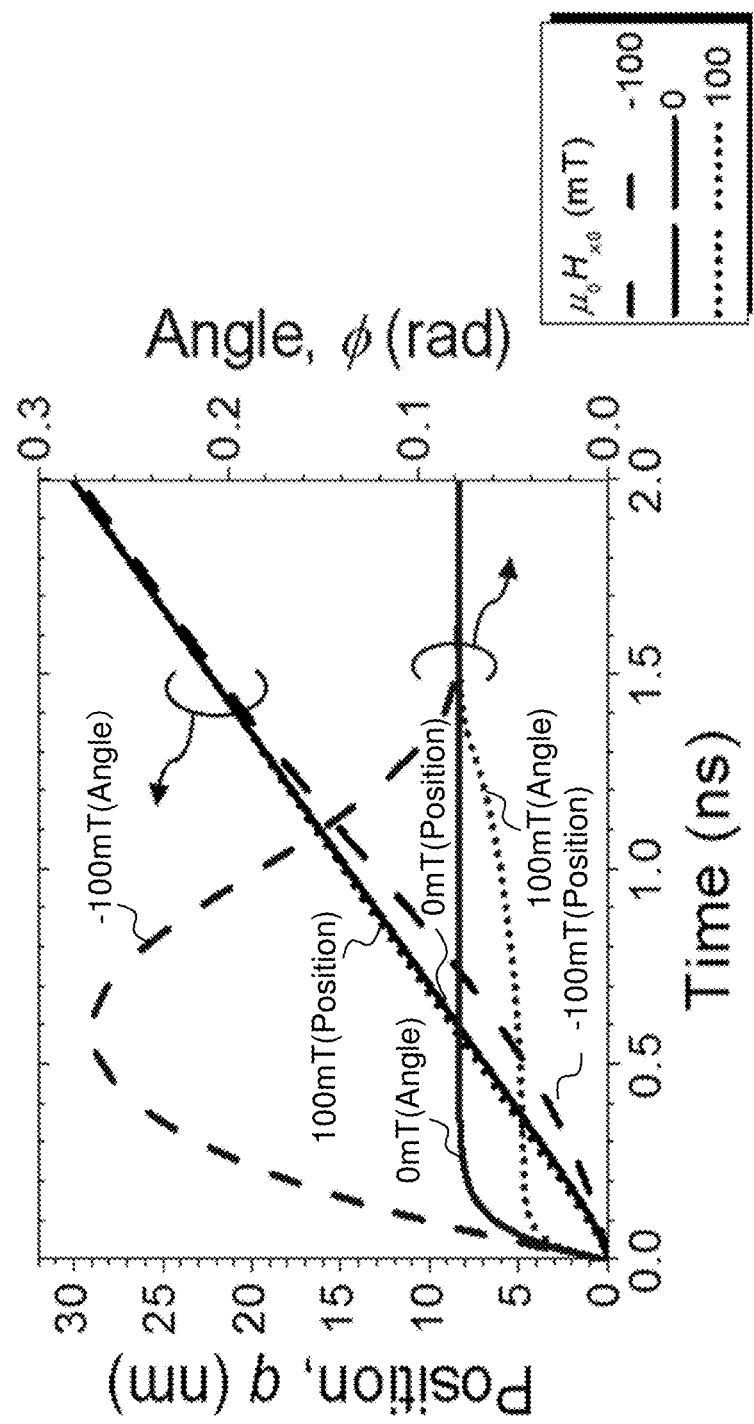
FIG. 10 shows calculation results of time evolution of a domain wall position q and a domain wall magnetization angle Φ when escaping from a constraint point derived from a local x-direction leakage field.

FIG. 10 shows calculation results of time evolution of collective coordinates q and φ when there is only the former constraint mechanism out of the above-described two constraint mechanisms of a domain wall. The dashed line, the solid line and the dotted line indicate calculation results when $\mu_0 H_{x0}$ is $-100$ mT, 0 mT and 100 mT, respectively. As is obvious from FIG. 10, while the time evolution of the domain wall magnetization angle Φ largely varies depending on $H_{x0}$, it hardly affects the time evolution of the domain wall position q in any case. As a result of calculation with a different applied current density, it is found that there is no threshold current when driving the domain wall constrained by the local x-direction leakage field with an electric current.

Figure 11:
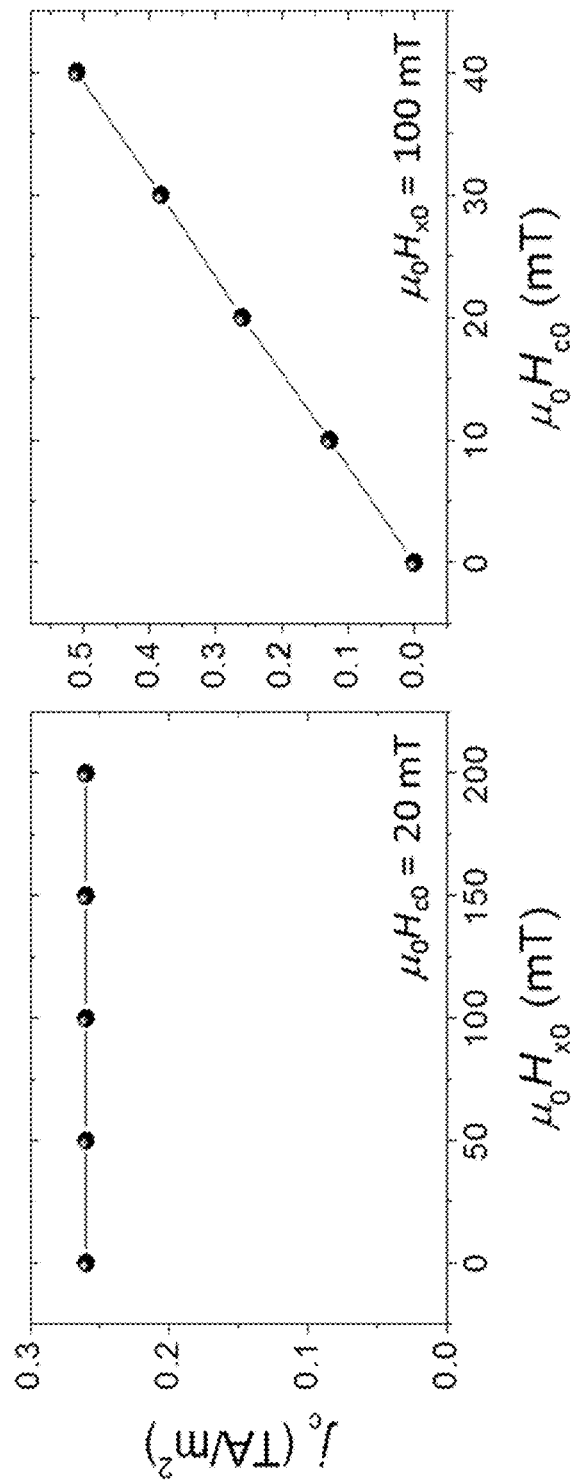
FIG. 11 shows calculation results of x-direction magnetic field dependence and pinning potential dependence of a current density required for a domain wall constrained by a local x-direction magnetic field and a local energy potential to escape from a constraint point.

FIG. 11 shows $H_{x0}$ dependence and $H_{c0}$ dependence of a threshold current density which are required for a domain wall to escape from a constraint point when there are both of the above-described two constraint mechanisms of the domain wall. FIG. 11 is different from FIG. 10 in that a finite threshold current density jc exists. Note that the threshold current density jc has different dependence on $H_{x0}$ and $H_{c0}$. Specifically, while the threshold current density jc does not depend on $H_{x0}$ at all, it linearly depends on $H_{c0}$.

On the other hand, it is found from analysis calculation on the basis of system energy that both $H_{x0}$ and $H_{c0}$ have linear dependence on a threshold field required for a domain wall to escape from a constraint point in the magnetic field. Specifically, while the threshold field has linear dependence on $H_{x0}$, the threshold current density jc does not have dependence on $H_{x0}$. This means that, by increasing the value of $H_{x0}$, the heat stability can increase to any level while the threshold current density does not increase. This is a very important property in terms of achieving both the heat stability and the low current characteristics of MRAM.

The primary point of the first exemplary embodiment is to constrain a domain wall using the local x-direction leakage field and drive the domain wall with a small electric current in the information storage state. In other words, it is preferred that the x component of a leakage field generated in the leakage field generation layer (the first leakage field generation layer 51, the second leakage field generation layer 52) is as large as possible and the z component of the leakage field (the z component of the leakage field acts like the above-described $H_{c0}$) is sufficiently small at the position of the magnetic free layer 10.

Figure 12:
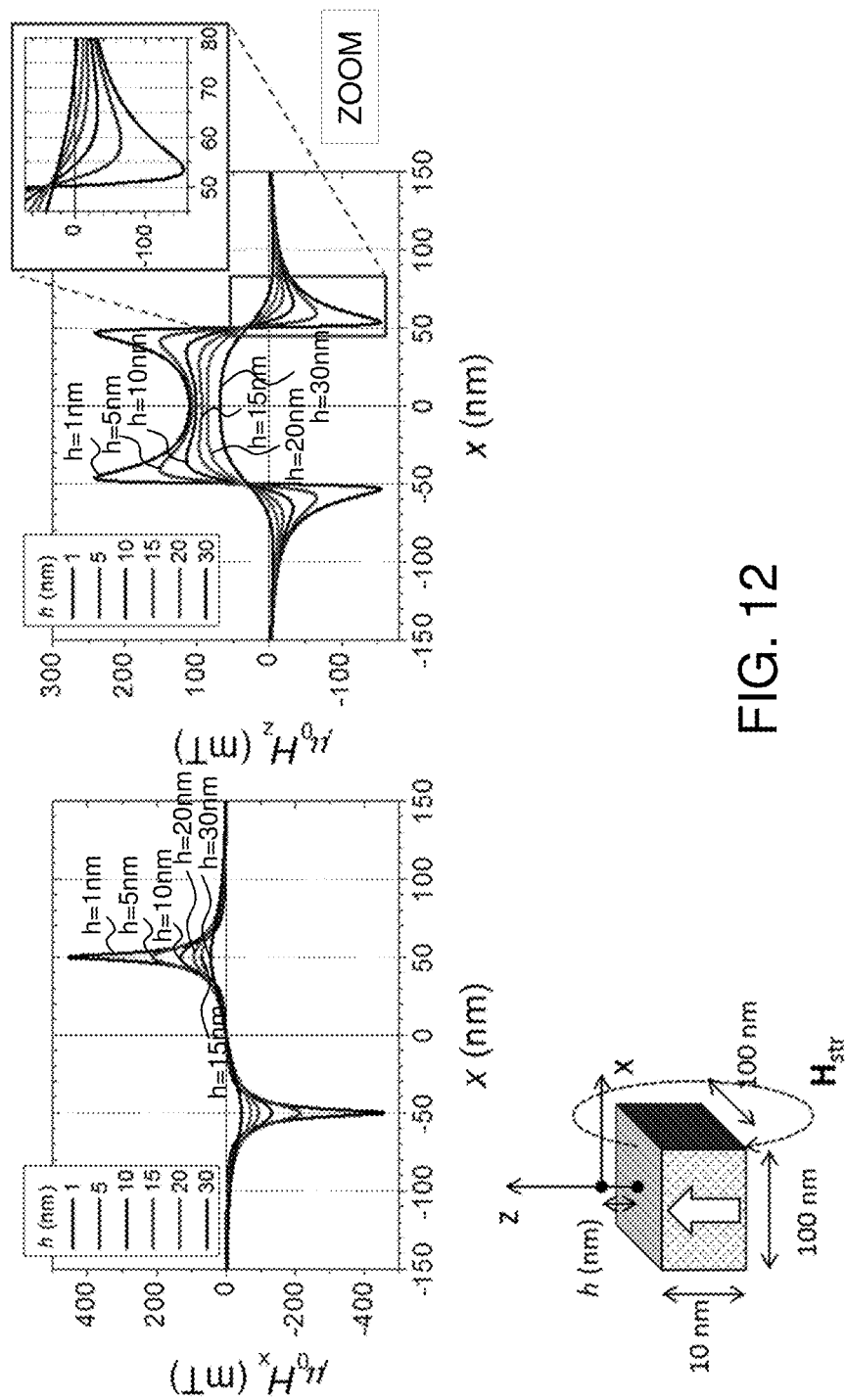
FIG. 12 shows calculation results of a leakage field from a leakage field generation layer.

FIG. 12 shows calculation results of a leakage field generated in the leakage field generation layer by the inventors of the present invention. It is assumed that the leakage field generation layer is a rectangular solid with a length of 100 nm in the x and y directions and a thickness of 10 nm in the x direction and having a saturation magnetization of 1000 emu/cc.

The graph in FIG. 12 shows calculation result where the x component and the z component of the leakage field formed at a height of h from the upper surface of the magnetic material are the horizontal axis. The graph shows that a large leakage field appears in both of the x and z directions at the edge of the leakage field generation layer. Referring to the enlarged diagram of the leakage field Hz in the z direction, $\mu_0 Hz$ at the edge decreases abruptly as the height h from the leakage field generation layer increases. Particularly, $\mu_0 Hz$ is equal to or less than 20 mT when the height h from the leakage field generation layer is equal to or greater than 10 nm, and $\mu_0 Hz$ is equal to or less than 10 mT when the height h from the leakage field generation layer is equal to or greater than 15 nm, which does not significantly affect the threshold current density jc. Therefore, the interval between the leakage field generation layer (the first leakage field generation layer 51, the second leakage field generation layer 52) and the center of the thickness of the magnetic free layer 10 is preferably equal to or greater than 10 nm or more preferably equal to or greater than 15 nm. Accordingly, the total thickness of the spacer layer (the first spacer layer 61, the second spacer layer 62) and the spin current generation layer 20 is preferably equal to or greater than 10 nm or more preferably equal to or greater than 15 nm.

<8. First Alternative Example>

FIGS. 13A to 13D are cross-sectional diagrams schematically showing the structure of the magnetoresistive device 100 according to a first alternative example of the first exemplary embodiment. The first alternative example is an exemplary embodiment where a domain wall formed in the magnetic free layer 10 has counterclockwise rotation.

Figure 13A:
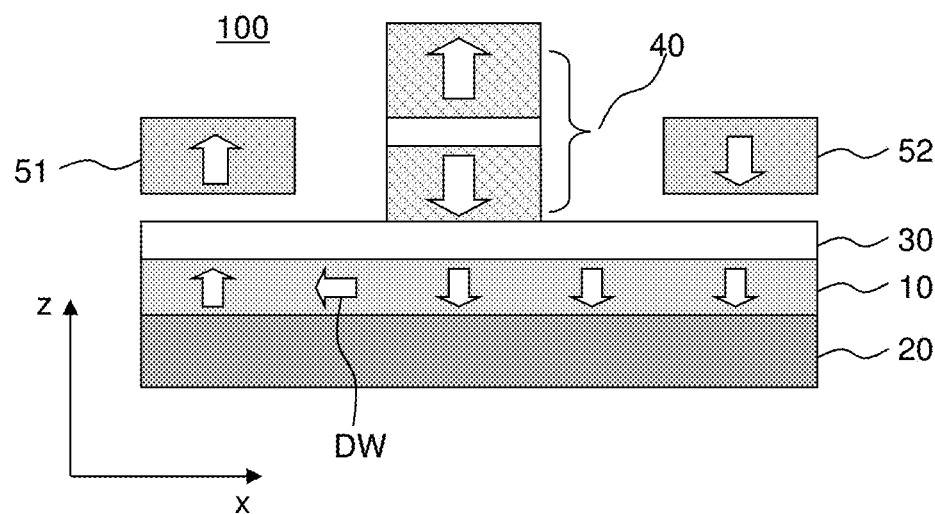
FIGS. 13A to 13D are diagrams illustrating the state of magnetization of a magnetoresistive device according to a first alternative example of the first exemplary embodiment.
Figure 13B:
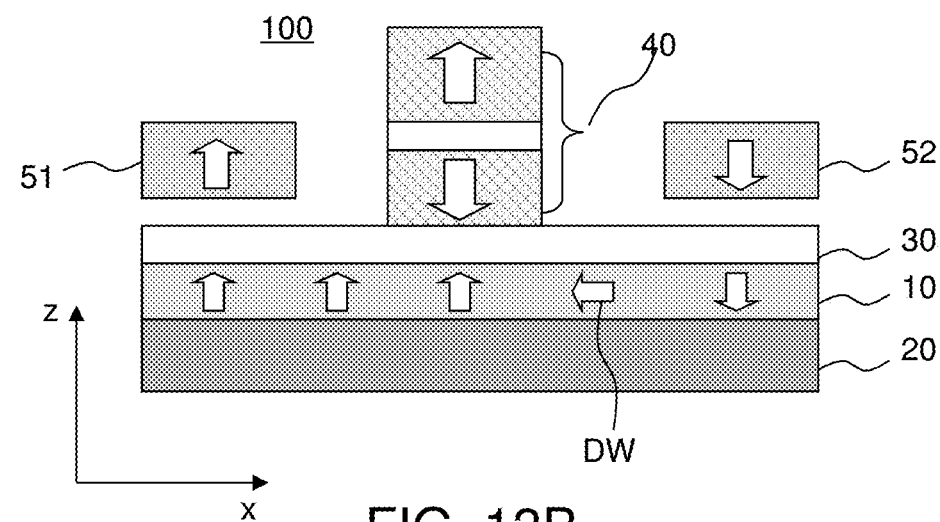

In the case where a domain wall formed in the magnetic free layer 10 has counterclockwise rotation, when the first magnetization fixed area 51 has a fixed magnetization in the +z direction and the second magnetization fixed area 52 has a fixed magnetization in the −z direction, the magnetization of the domain wall is oriented in the −x direction as shown in FIGS. 13A and 13B. In this case, by placing the leakage field generation layer (the first leakage field generation layer 51, the second leakage field generation layer 52) above (on the +z side of) the magnetic free layer 10, it is possible to constrain the domain wall by the leakage field. Note that FIG. 13A shows the magnetization arrangement in "0" state and 13B shows that in the "1" state. As is obvious from those figures, the leakage field from the leakage field generation layer (the first leakage field generation layer 51, the second leakage field generation layer 52) has a −x direction component at the position of the domain wall.

Figure 13C:
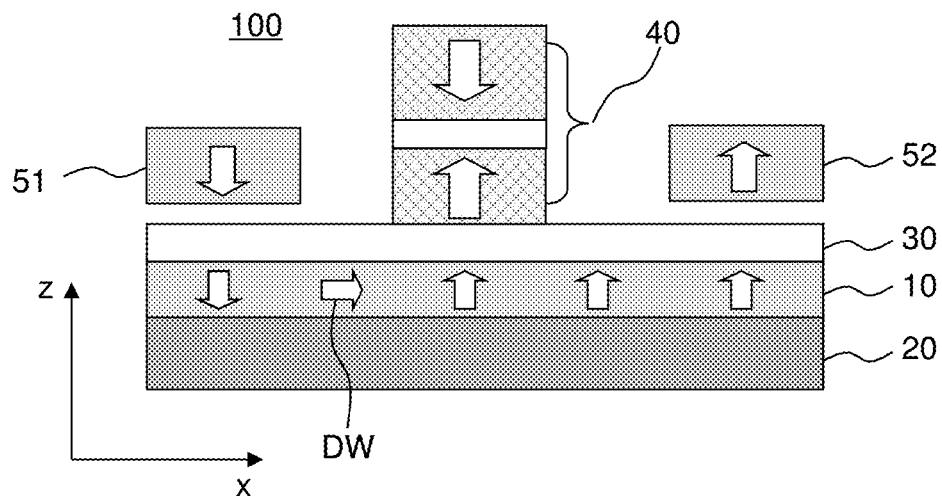
Figure 13D:
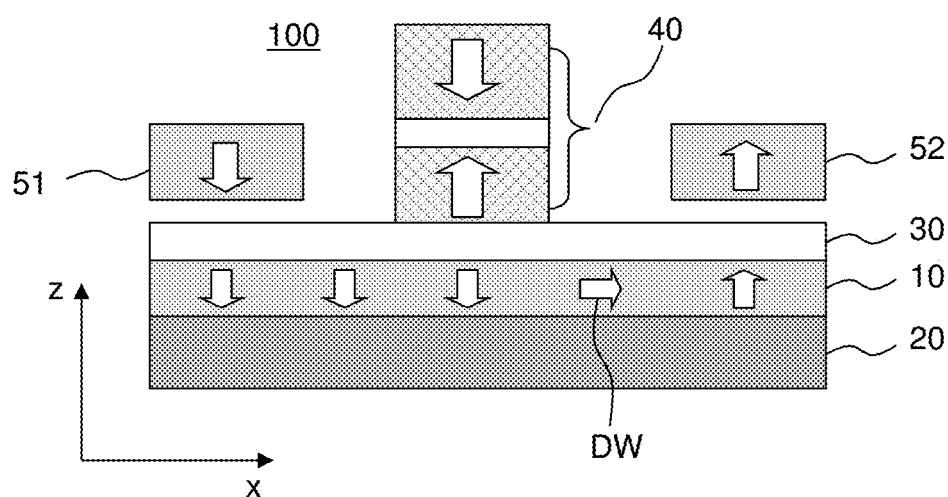

FIGS. 13C and 13D show the magnetization arrangement in "0" state and in the "1" state, respectively, when the first magnetization fixed area 51 has a fixed magnetization in the −z direction and the second magnetization fixed area 52 has a fixed magnetization in the +z direction. In this case, the leakage field from the leakage field generation layer (the first leakage field generation layer 51, the second leakage field generation layer 52) has a +x direction component at the position of the domain wall, which coincides with the magnetization direction of the domain wall.

Note that, in the example of FIGS. 13A and 13B, the leakage field generation layer (the first leakage field generation layer 51, the second leakage field generation layer 52) is electrically isolated from the magnetic free layer 10; however, it may be placed in any way as long as it is within the range where a leakage field is applied, regardless of electrical connection.

Note that, it is described earlier that the distance between the upper surface of the leakage field generation layer (the first leakage field generation layer 51, the second leakage field generation layer 52) and the center of the thickness of the magnetic free layer 10 is preferably equal to or greater than 10 nm or more preferably equal to or greater than 15 nm. However, in the case where the leakage field generation layer (the first leakage field generation layer 51, the second leakage field generation layer 52) is placed above the magnetic free layer 10, this distance is defined as the distance between the center of the thickness of the magnetic free layer 10 and the lower surface of the leakage field generation layer (the first leakage field generation layer 51, the second leakage field generation layer 52).

<9. Second Alternative Example>

Figure 14A:
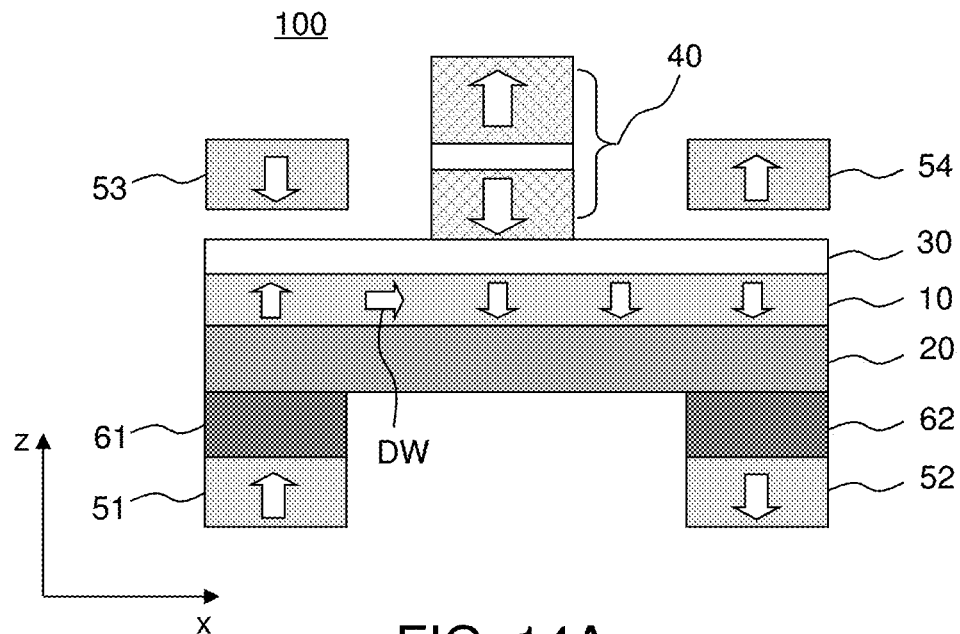
FIGS. 14A and 14B are diagrams illustrating the state of magnetization of a magnetoresistive device according to a second alternative example of the first exemplary embodiment.
Figure 14B:
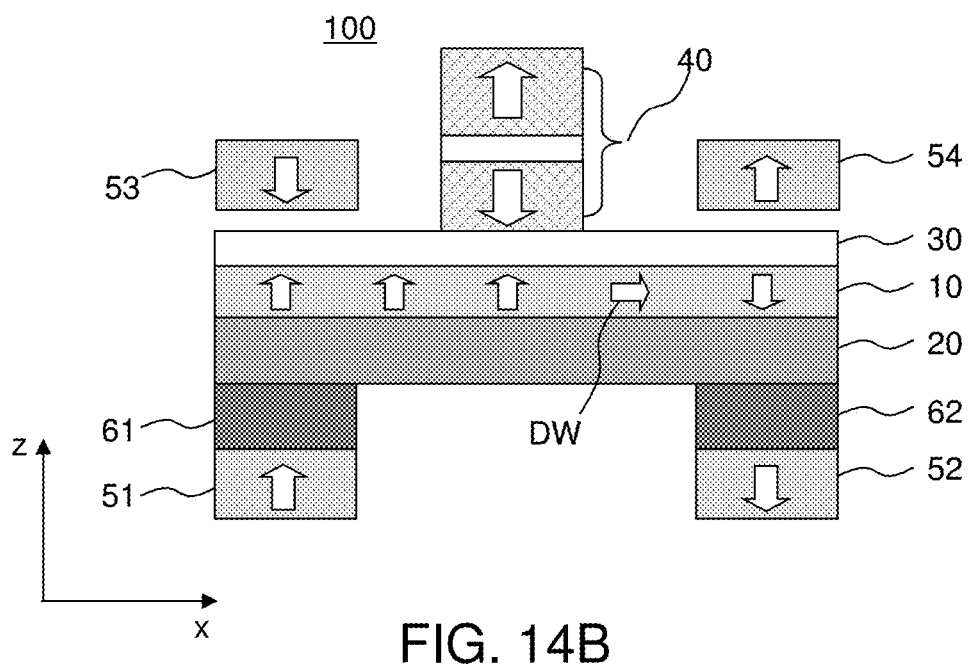

FIGS. 14A and 14B are cross-sectional diagrams schematically showing the structure of the magnetoresistive device 100 according to a second alternative example of the first exemplary embodiment. FIG. 14A corresponds to the "0" state and 14B corresponds to the "1" state. In the second alternative example, the first leakage field generation layer 51, the second leakage field generation layer 52, a third leakage field generation layer 53 and a fourth leakage field generation layer 54 are formed as the leakage field generation layer.

The first leakage field generation layer 51 and the second leakage field generation layer 52 are placed below (on the −z side of) the magnetic free layer 10, and the third leakage field generation layer 53 and the fourth leakage field generation layer 54 are placed above (on the +z side of) the magnetic free layer 10.

In the second exemplary embodiment, the first leakage field generation layer 51 is placed below the first magnetization fixed area 11, and the third leakage field generation layer 53 is placed above the first magnetization fixed area 11. It is thereby possible to reduce the leakage field in the z direction and increase the leakage field in the x direction respectively at the position of the domain wall. In FIG. 11, it is found from experimental results that the leakage field in the z direction increases the current density required for driving the domain wall with an electric current while the leakage field in the x direction does not affect it. With use of the second exemplary embodiment, it is possible to increase the heat stability of the element by an increase in the x-direction leakage field and reduce a write current by a decrease in the z-direction leakage field.

<10. Third Alternative Example>

Figure 15A:
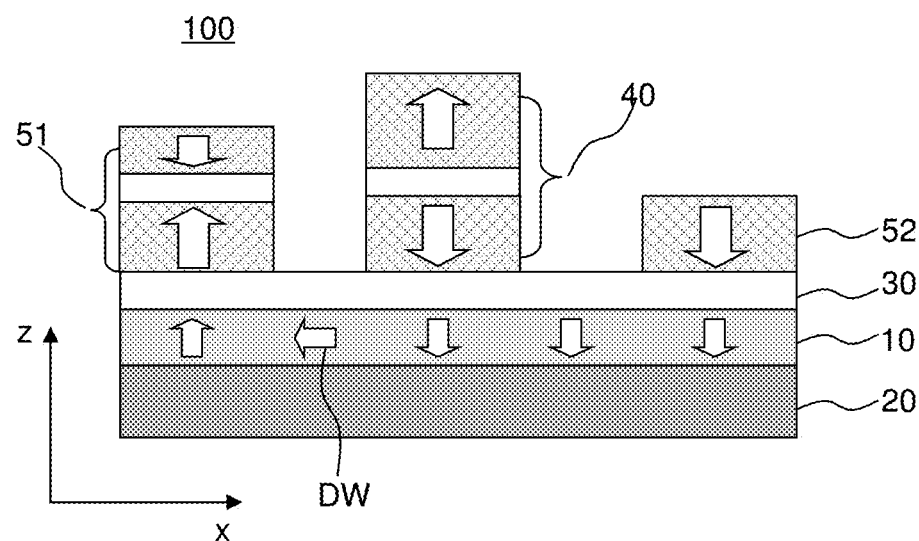
FIGS. 15A and 15B are diagrams illustrating the state of magnetization of a magnetoresistive device according to a third alternative example of the first exemplary embodiment.
Figure 15B:
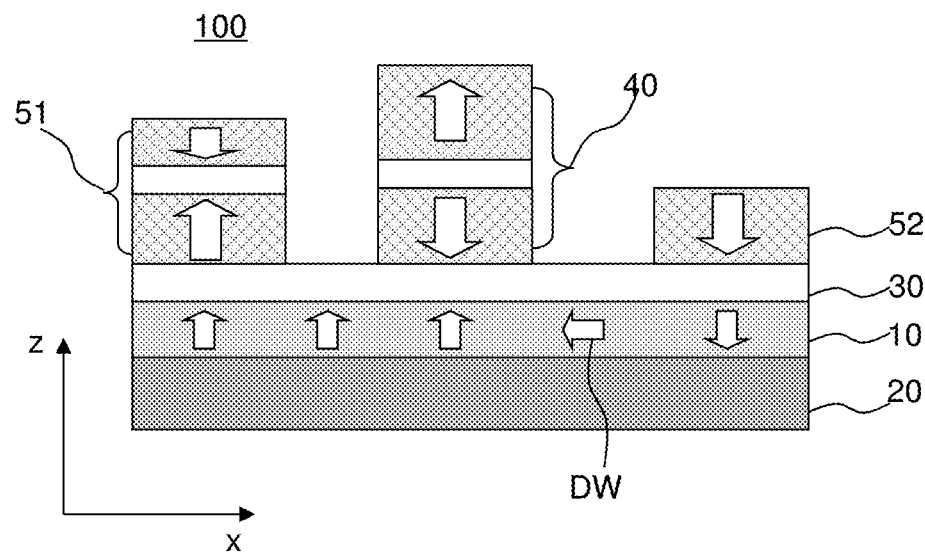

FIGS. 15A and 15B are cross-sectional diagrams schematically showing the structure of the magnetoresistive device 100 according to a third alternative example of the first exemplary embodiment. FIG. 15A corresponds to the "0" state and 15B corresponds to the "1" state. In the third alternative example, the reference layer 40 and the leakage field generation layer (the first leakage field generation layer 51, the second leakage field generation layer 52) are formed in the same layer using the same material. By forming the reference layer 40 and the leakage field generation layer (the first leakage field generation layer 51, the second leakage field generation layer 52) in the same layer, the need for a process of forming the leakage field generation layer is eliminated, which allows the reduction of the number of process steps. Note that, in the example of FIGS. 15A and 15B, the height of the upper surface is different between the first leakage field generation layer 51 and the second leakage field generation layer 52, thereby differentiating the magnetic properties.

<11. Fourth Alternative Example>

Figure 16A:
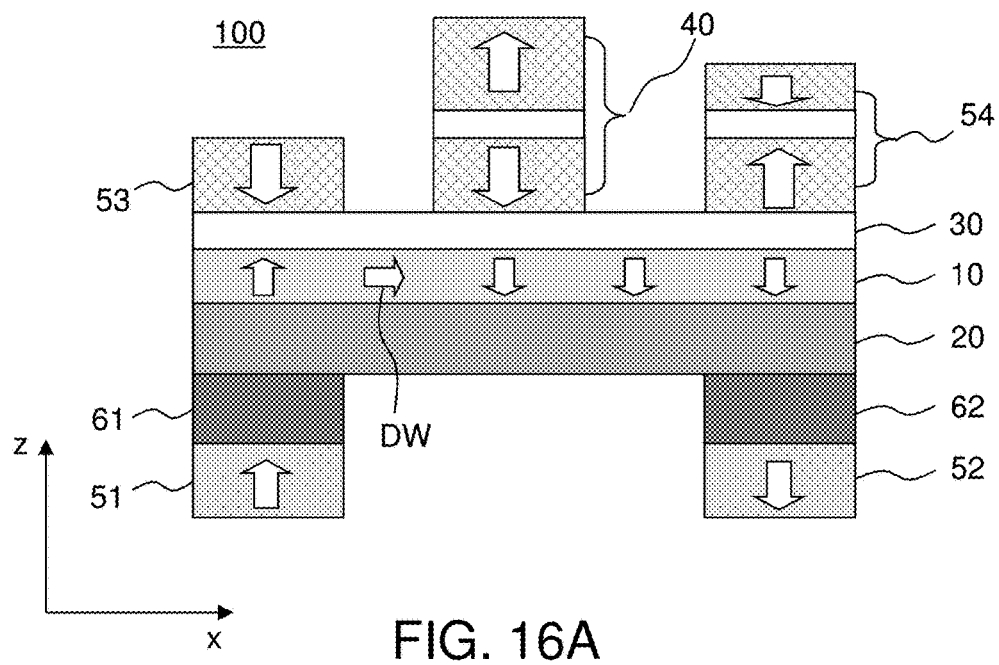
FIGS. 16A and 16B are diagrams illustrating the state of magnetization of a magnetoresistive device according to a fourth alternative example of the first exemplary embodiment.
Figure 16B:
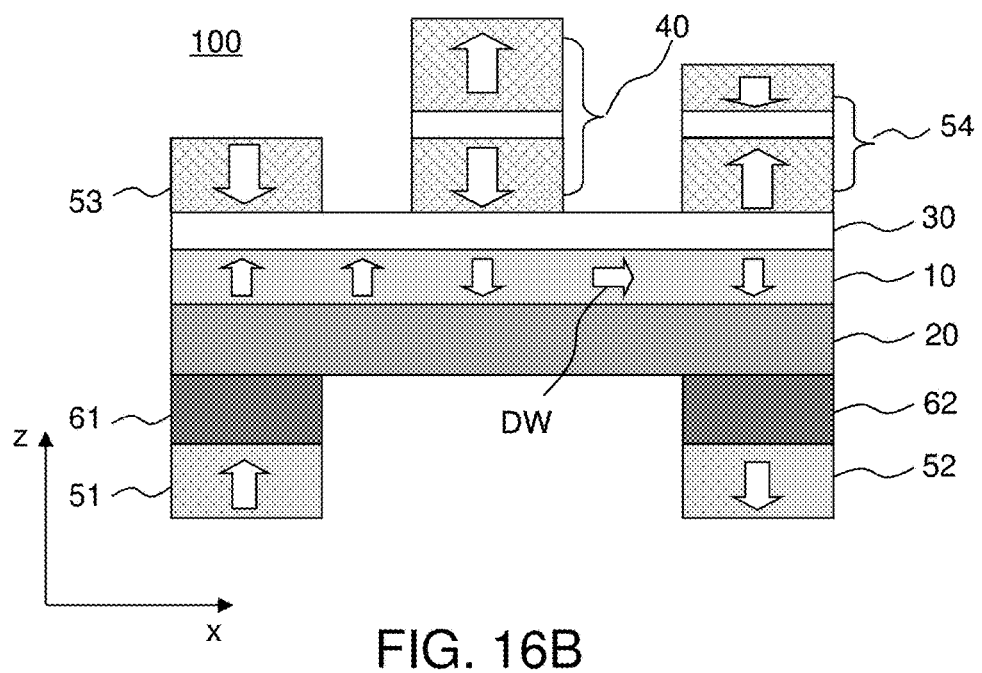

FIGS. 16A and 16B are cross-sectional diagrams schematically showing the structure of the magnetoresistive device 100 according to a fourth alternative example of the first exemplary embodiment. FIG. 16A corresponds to the "0" state and 16B corresponds to the "1" state. The fourth alternative example combines the technical ideas of the second and third alternative examples. The fourth leakage field generation layer 51 and the second leakage field generation layer 52 are formed below (on the −z side of) the magnetic free layer 10, and the third leakage field generation layer 53 and the fourth leakage field generation layer 54 are formed in the same layer and the same material as the reference layer 40 above (on the +z side of) the magnetic free layer 10.

<12. Fifth Alternative Example>

Figure 17:
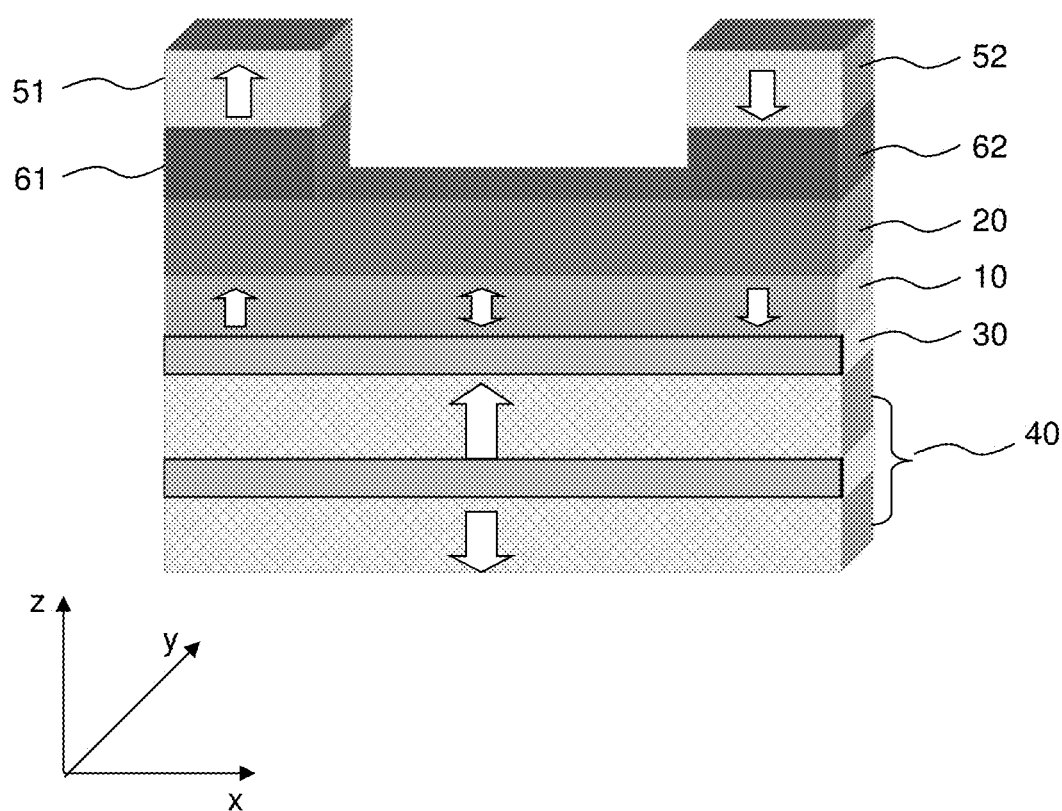
FIG. 17 is a schematic diagram showing one example of a magnetoresistive device according to a fifth alternative example of the first exemplary embodiment.

FIG. 17 is a perspective diagram schematically showing the structure of the magnetoresistive device 100 according to a fifth alternative example of the first exemplary embodiment. In the fifth alternative example, the reference layer 40, the tunnel barrier layer 30, the magnetic free layer 10 and the spin current generation layer 20 are assembled in this order from the substrate side. The reference layer 40 is processed into the same shape as the magnetic free layer 10. As shown in FIG. 17, in the magnetoresistive device 100 according to the exemplary embodiment, the order of assembling the reference layer 40, the tunnel barrier layer 30, the magnetic free layer 10 and the spin current generation layer 20 is arbitrary, and the size of the reference layer 40 is also arbitrary.

<13. Sixth Alternative Example>

Figure 18A:
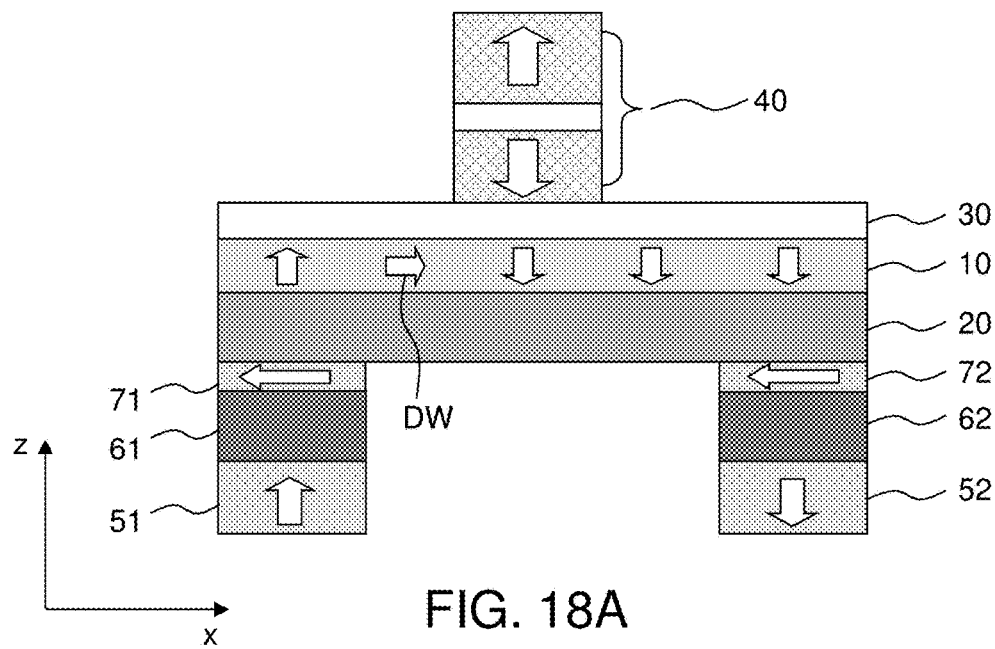
FIGS. 18A and 18B are diagrams illustrating the state of magnetization of a magnetoresistive device according to a sixth alternative example of the first exemplary embodiment.
Figure 18B:
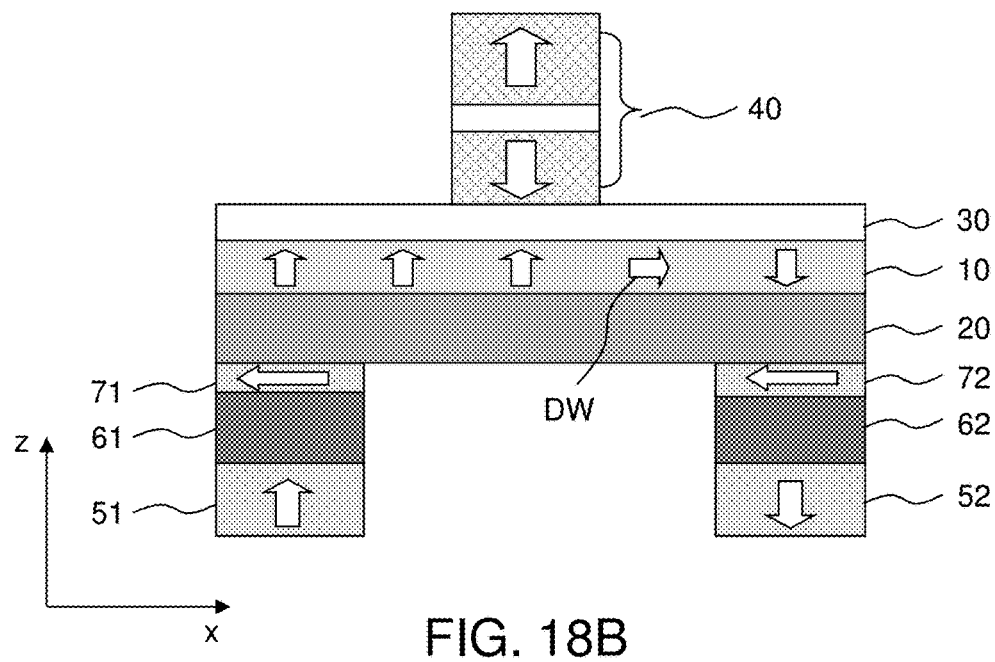

FIGS. 18A and 18B are cross-sectional diagrams schematically showing the structure of the magnetoresistive device 100 according to a sixth alternative example of the first exemplary embodiment. FIG. 18A corresponds to the "0" state and 18B corresponds to the "1" state. In the sixth alternative example, an in-plane leakage field generation layer (a first in-plane leakage field generation layer 71, a second in-plane leakage field generation layer 72) with an in-plane magnetic anisotropy is placed.

The in-plane leakage field generation layer (the first in-plane leakage field generation layer 71, the second in-plane leakage field generation layer 72) is placed to increase a leakage field in ±directions at the position of a domain wall. In FIGS. 18A and 18B, the first magnetization fixed area 11 and the first leakage field generation layer 51 have a fixed magnetization in the upward direction (+z direction) and the second magnetization fixed area 12 and the second leakage field generation layer 52 have a fixed magnetization in the downward direction (−z direction). FIGS. 18A and 18B show the casse where the domain wall has clockwise rotation.

The orientation of the magnetization of the first in-plane leakage field generation layer 71 and the second in-plane leakage field generation layer 72 is fixed to the −x direction in FIGS. 18A and 18B. In some cases, however, the leakage field in the x direction at the position of the domain wall can be larger when the magnetization is fixed to the +x direction depending on the positions where the first in-plane leakage field generation layer 71 and the second in-plane leakage field generation layer 72 are placed. A manufacturer is allowed to design this in an appropriate way.

Further, although the in-plane leakage field generation layer (the first in-plane leakage field generation layer 71, the second in-plane leakage field generation layer 72) is formed between the spin current generation layer 20 and the spacer layer (the first spacer layer 61, the second spacer layer 62) in FIGS. 18A and 18B, the position where the in-plane leakage field generation layer (the first in-plane leakage field generation layer 71, the second in-plane leakage field generation layer 72) is placed is not limited thereto in practice. For example, the in-plane leakage field generation layer (the first in-plane leakage field generation layer 71, the second in-plane leakage field generation layer 72) may be placed between the leakage field generation layer (the first leakage field generation layer 51, the second leakage field generation layer 52) and the spacer layer (the first spacer layer 61, the second spacer layer 62), below the leakage field generation layer (the first leakage field generation layer 51, the second leakage field generation layer 52), or above the magnetic free layer 10.

<14. Seventh Alternative Example>

Figure 19A:
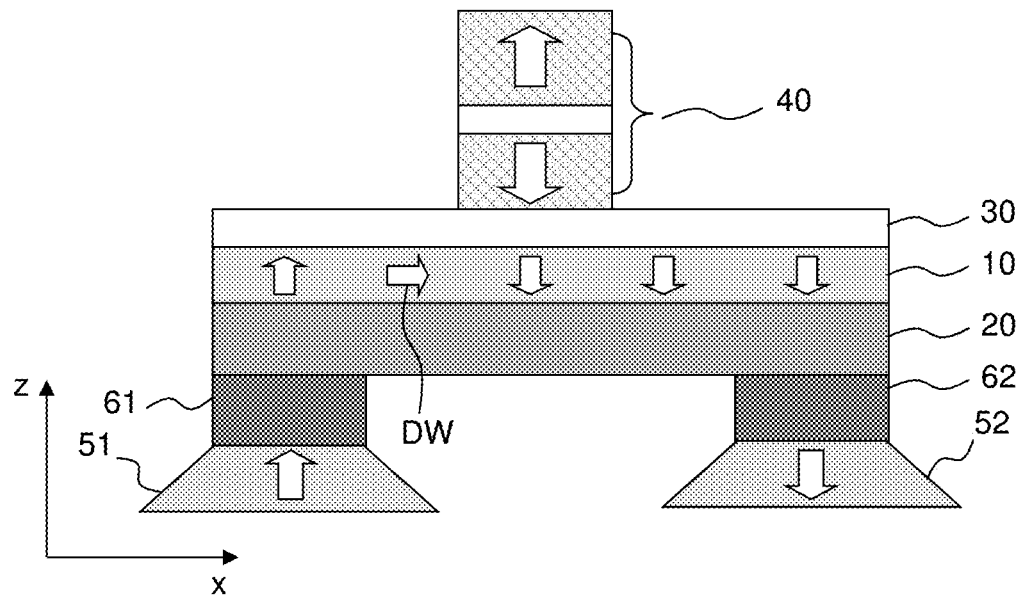
FIGS. 19A and 19B are diagrams illustrating the state of magnetization of a magnetoresistive device according to a seventh alternative example of the first exemplary embodiment.
Figure 19B:
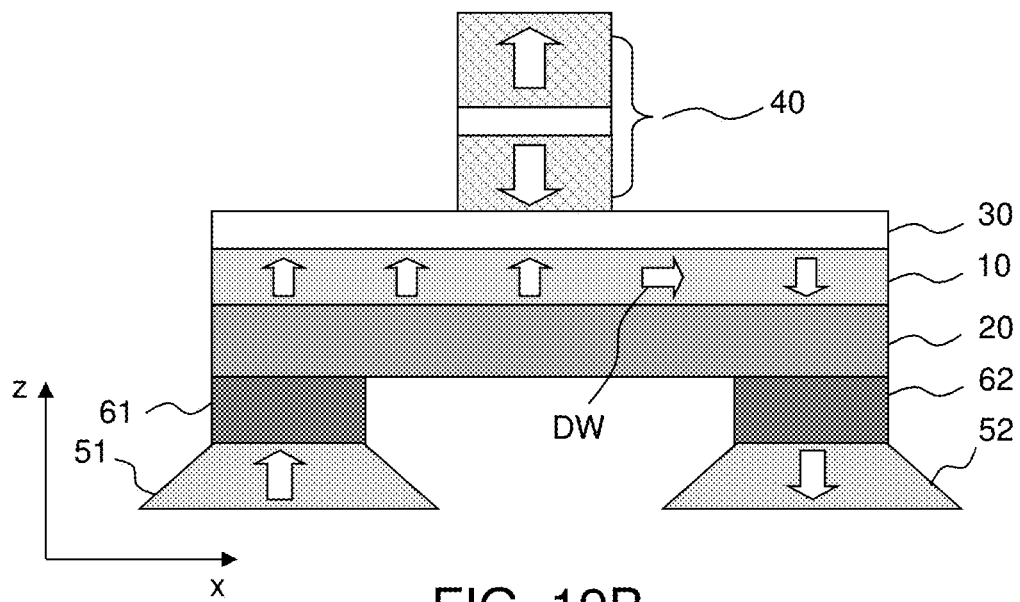

FIGS. 19A and 19B are cross-sectional diagrams schematically showing the structure of the magnetoresistive device 100 according to a seventh alternative example of the first exemplary embodiment. FIG. 19A corresponds to the "0" state and 19B corresponds to the "1" state. In the seventh alternative example, the leakage field generation layer (the first leakage field generation layer 51, the second leakage field generation layer 52) is designed to be tapered. As shown in FIGS. 19A and 19B, by forming the leakage field generation layer (the first leakage field generation layer 51, the second leakage field generation layer 52) in a tapered shape, it is possible to adjust the leakage field in the x direction and the z direction at the position of the domain wall. Note that, although FIGS. 19A and 19B show an example in which the leakage field generation layer (the first leakage field generation layer 51, the second leakage field generation layer 52) is processed into a trapezoid shape with the lower base longer than the upper base, it may be processed into a trapezoid shape with the lower base shorter than the upper base.

Further, the seventh alternative example is also applicable to the case where the leakage field generation layer (the first leakage field generation layer 51, the second leakage field generation layer 52) is placed above the magnetic free layer 10.

The leakage field generation layer (the first leakage field generation layer 51, the second leakage field generation layer 52) may be processed into a tapered shape by adjusting the shape of a hard mask, etching gas, etching conditions and the like.

<15. Eighth Alternative Example>

Figure 20A:
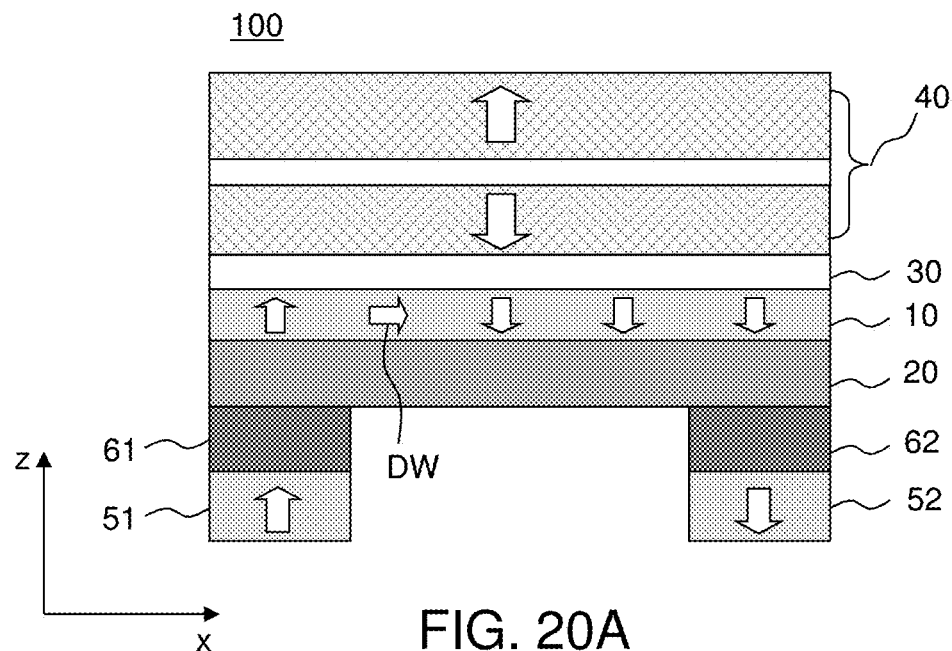
FIGS. 20A and 20B are diagrams illustrating the state of magnetization of a magnetoresistive device according to an eighth alternative example of the first exemplary embodiment.
Figure 20B:
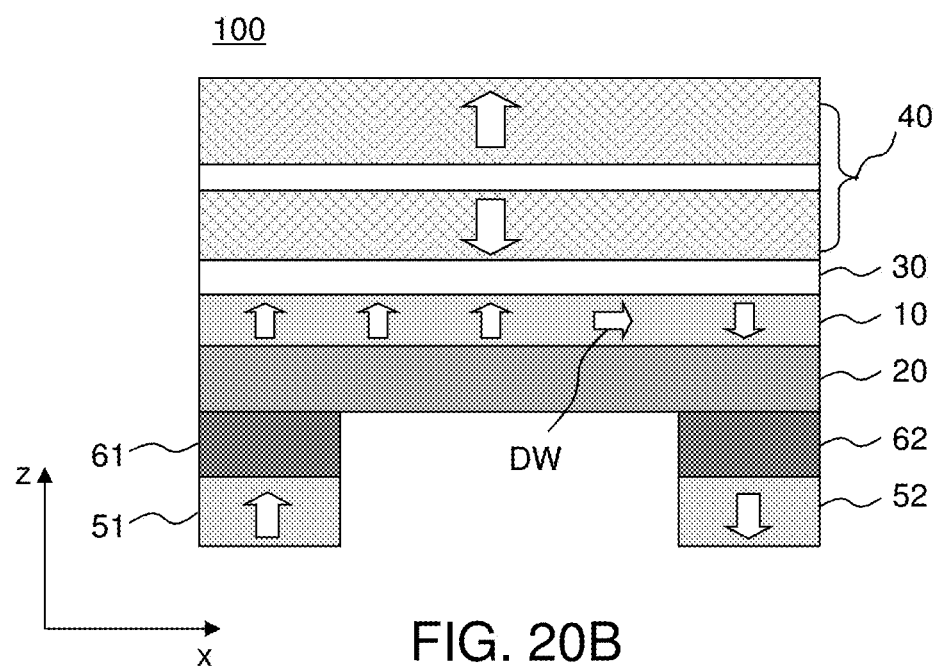

FIGS. 20A and 20B are cross-sectionals schematically showing the structure of the magnetoresistive device 100 according to an eighth alternative example of the first exemplary embodiment. In the eighth alternative example, the reference layer 40 and the magnetic free layer 10 are formed in the same shape. In general, the reference layer 40 may have any shape as long as it overlaps the magnetization free area 13 in the magnetic free layer 10 on the x-y plane. Further, although the reference layer 40 also generates a leakage field, and this magnetic field is applied also to the magnetic free layer 10, the leakage field applied to the magnetization free area 13 can be reduced by forming the reference layer 40 in a larger area than the magnetization free area 13 shown in the eighth alternative example.

<16. Second Exemplary Embodiment>

A structure and an operating method of the magnetoresistive device 100 according to a second exemplary embodiment are described hereinbelow. In the first exemplary embodiment, it is described that the leakage field generation layer (the first leakage field generation layer 51 and the second leakage field generation layer 52) at least partly includes a ferromagnetic material with a perpendicular magnetic anisotropy. On the other hand, in the second exemplary embodiment, the leakage field generation layer (the first leakage field generation layer 51 and the second leakage field generation layer 52) at least partly includes a ferromagnetic material with an in-plane magnetic anisotropy.

Figure 21A:
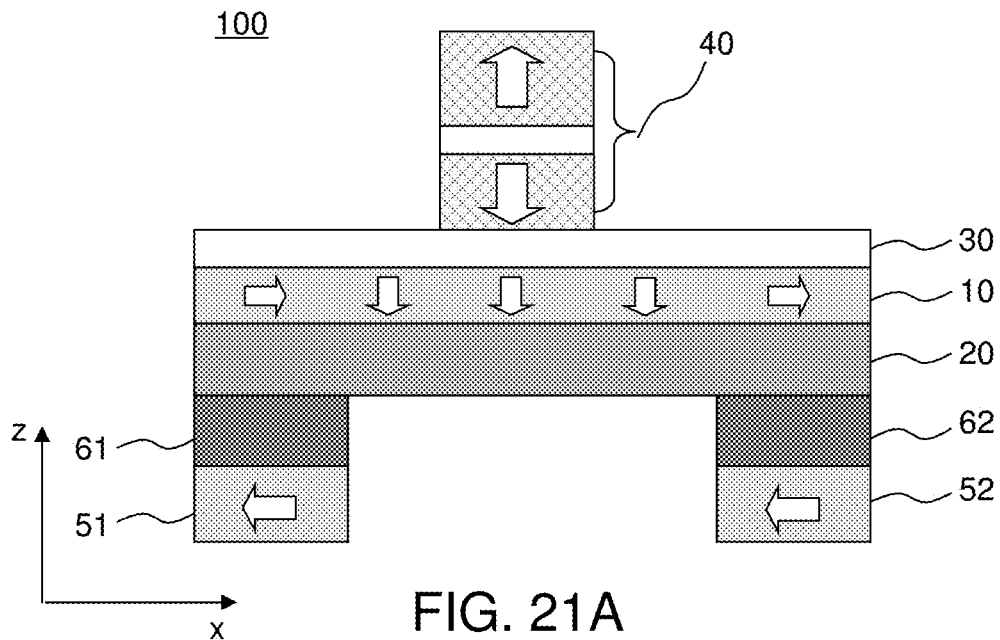
FIGS. 21A and 21B are diagrams illustrating the state of magnetization of a magnetoresistive device according to a second exemplary embodiment.
Figure 21B:
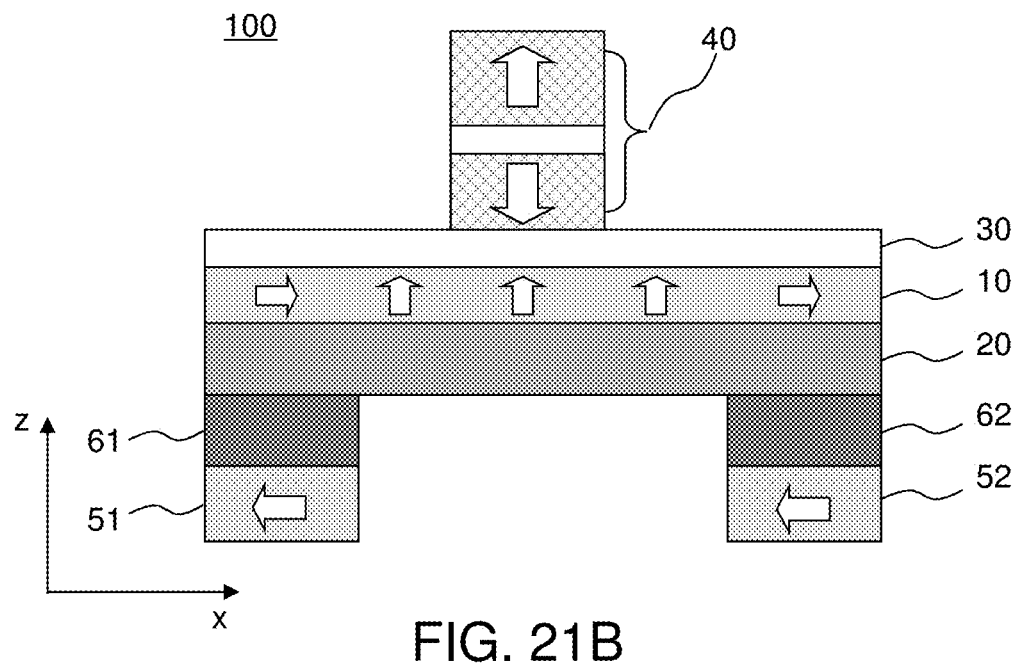

FIGS. 21A and 21B are schematic diagrams showing a magnetization structure in the states where "0" is stored and where "1" is stored, respectively, as memory information in the magnetoresistive device 100 according to the second exemplary embodiment. In the example of FIGS. 21A and 21B, the first leakage field generation layer 51 and the second leakage field generation layer 52 have a fixed magnetization in the in-plane direction, which is oriented in the −x direction. In this case, a leakage field in the +x direction is applied to the first magnetization fixed area 11 formed above first leakage field generation layer 51 and the second magnetization fixed area 12 formed above the second leakage field generation layer 52, and consequently the magnetization of the first magnetization fixed area 11 and the second magnetization fixed area 12 is fixed to the +x direction.

Further, while a 180° domain wall is formed in the magnetic free layer 10 in the first exemplary embodiment, a 90° domain wall is formed in the magnetic free layer 10 in the second exemplary embodiment. When the formed domain wall is a 90° domain wall as well, it is possible to drive this domain wall along an electric current or an spin current of electron by the spin Hall effect described with the first exemplary embodiment as long as the domain wall has a magnetic component along the long side of the magnetic free layer 10 (which is +x direction in the example of FIGS. 21A and 21B), and the moving direction of the domain wall is determined by the sign of the spin Hall angle.

Information writing and reading methods, a circuit structure and the like in the second exemplary embodiment are the same as those in the first exemplary embodiment and thus not redundantly described.

Further, in the case of the second exemplary embodiment, a magnetic field is applied from the leakage field generation layer (the first leakage field generation layer 51, the second leakage field generation layer 52) along in-plane without the Dzyaloshinskii-Moriya interaction, and therefore it is possible to move the domain wall by the spin Hall effect. Further, in the second exemplary embodiment, the first leakage field generation layer 51 and the second leakage field generation layer 52 may have a fixed magnetization in the same direction. This is more preferred than the first exemplary embodiment in terms of easiness of manufacturing.

Materials that can be used for the respective layers in the second exemplary embodiment are the same as those in the first exemplary embodiment and thus not redundantly described, except for the leakage field generation layer (the first leakage field generation layer 51, the second leakage field generation layer 52). For the leakage field generation layer (the first leakage field generation layer 51, the second leakage field generation layer 52), a ferromagnetic material with an in-plane magnetic anisotropy can be used. To be specific, Fe, Co, Ni, Fe—Co, Fe—Co—Ni or the like may be used. Further, another element may be added to enhance coercivity. Furthermore, an antiferromagnetic material may be placed in contact for more stable fixation of a magnetization. Examples of an antiferromagnetic material that can be used are Pt—Mn, Ir—Mn, Fe—Mn, Ni—Mn and the like.

Figure 22A:
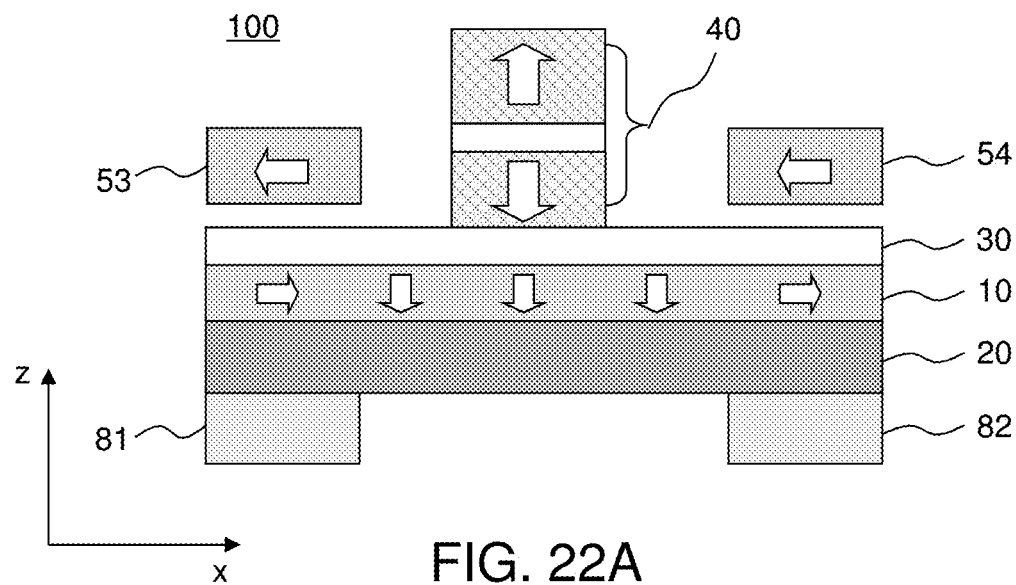
FIGS. 22A and 22B are diagrams illustrating the state of magnetization of a magnetoresistive device according to a first alternative example of the second exemplary embodiment.
Figure 22B:
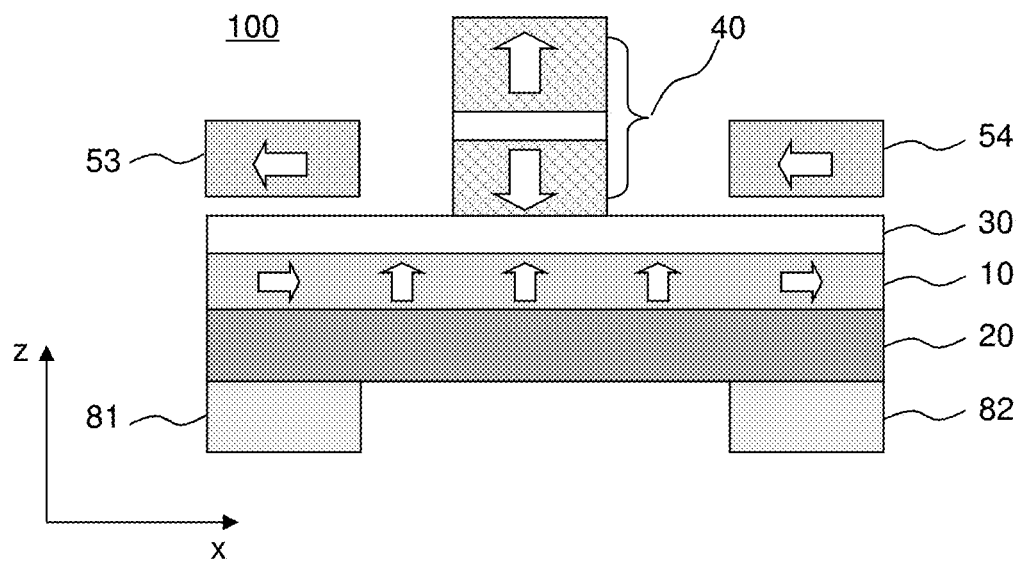

FIGS. 22A and 22B schematically show the structure of the magnetoresistive device 100 according to a first alternative example of the second exemplary embodiment. FIGS. 22A and 22B are schematic diagrams showing a magnetization structure in the states where "0" is stored and where "1" is stored, respectively, as memory information.

In this alternative example, the leakage field generation layer (the third leakage field generation layer 53, the fourth leakage field generation layer 54) is electrically isolated from the magnetic free layer 10. Even when the leakage field generation layer (the third leakage field generation layer 53, the fourth leakage field generation layer 54) is electrically isolated from the magnetic free layer 10, the position of the leakage field generation layer (the third leakage field generation layer 53, the fourth leakage field generation layer 54) is not particularly limited as long as a sufficient leakage field is applied to the magnetic free layer 10. Further, in the case of this alternative example, a first plug layer 81 and a second plug layer 82 are respectively placed in contact with the both ends of the spin current generation layer 20 as a layer to introduce a write current into the spin current generation layer 20. The first plug layer 81 and the second plug layer 82 are electrically connected to a write cell transistor.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention as defined by the claims.

INDUSTRIAL APPLICABILITY

The magnetoresistive device 100 and the MRAM 300 according to the present invention are applicable not only to a large-scale memory array like a Mbit or Gbit density memory but also to a Kbit or Mbit cache memory operating at high speed or a single-bit or several-bit transitory memory like a resistor placed in the logical area of a system LSI, and further to a memory in the logic-in-memory architecture.

Industrial applicability of the present invention includes a nonvolatile semiconductor memory device used in a mobile device such as a cell phone or a personal computer, a transitory storage device such as a cache memory or a resistor connected to a memory part and a logic part of a microcomputer containing a nonvolatile memory used in an automobile, a game machine or the like.

What is claimed is:
1. A magnetoresistive device, comprising:
a magnetic free layer having first and second surfaces, the magnetic free layer being comprised of a ferromagnetic material having a perpendicular magnetic anisotropy;
a spin current generation layer contacting the first surface of the magnetic free layer;
a tunnel barrier layer having one surface contacting the second surface of the magnetic free layer;
a reference layer contacting another surface of the tunnel barrier layer; and
a leakage field generation layer including first and second leakage field generation layers each of which is comprised of a ferromagnetic material and generates a leakage field, an in-plane component of the leakage field at a part of the magnetic free layer is formed generating a domain wall having an in-plane magnetization component in the magnetic free layer, wherein
the in-plane magnetization component of the domain wall is in a direction parallel to a direction in which the current flows in the spin current generation layer.

2. The magnetoresistive device according to claim 1, wherein
the ferromagnetic material constituting the first and second leakage field generation layers has a perpendicular magnetic anisotropy,
the first and second leakage field generation layers have a fixed magnetization having an opposite directions, and are non-overlapping in a vertical direction, and
said in-plane component of the leakage field has a magnetization direction that is the same as a magnetization direction of the domain wall that is preferentially formed in the magnetic free layer due to a Dzyaloshinskii-Moriya interaction.

3. The magnetoresistive device according to claim 1, wherein
the magnetic free layer has a first magnetization fixed area, a second magnetization fixed area and a magnetization free area that are non-overlapping in a vertical direction,
the first leakage field generation layer overlaps the first magnetization fixed area in the vertical direction, and
the second leakage field generation layer overlaps the second magnetization fixed area in the vertical direction.

4. The magnetoresistive device according to claim 2, wherein
the leakage field generation layer is formed below the first surface of the magnetic free layer, and
a first distance in the vertical direction between an upper surface of the leakage field generation layer and a center position of a thickness of the magnetic free layer is equal to or greater than 10 nm.

5. The magnetoresistive device according to claim 4, wherein the first and second distances are equal to or greater than 15 nm.

6. The magnetoresistive device according to claim 2, wherein
the leakage field generation layer is formed above the second surface of the magnetic free layer, and
a second distance in the vertical direction between a lower surface of the leakage field generation layer and the center position of the thickness of the magnetic free layer is equal to or greater than 10 nm.

7. The magnetoresistive device according to claim 6, wherein the first and second distances are equal to or greater than 15 nm.

8. The magnetoresistive device according to claim 1, further comprising a spacer layer contacting the leakage field generation layer and between the second surface of the magnetic free layer and the leakage field generation layer.

9. The magnetoresistive device according to claim 1, further comprising third and fourth leakage field generation layers, wherein
the first and second leakage layers are formed on the first surface of the magnetic free layer, and
the third and fourth layers are formed on the second surface of the magnetic free layer.

10. The magnetoresistive device according to claim 2, wherein the leakage field generation layer is formed at a same layer level as the reference layer with respect to the magnetic free layer.

11. The magnetoresistive device according to claim 2, further comprising first and second in-plane leakage field generation layers each of which is formed between the magnetic free layer and the leakage field generation layer.

12. The magnetoresistive device according to claim 1, wherein
the first and second leakage field generation layers each has a surface closer to the magnetic free layer and an opposite surface further from the magnetic free layer, and
the first and second leakage field generation layers each are tapered from the closer surface toward the further surface.

13. The magnetoresistive device according to claim 1, wherein the first and second leakage field generation layers are each comprised of a ferromagnetic material and have an in-plane magnetic anisotropy.

14. A magnetoresistive random access memory, comprising:
the magnetoresistive device according to claim 1;
a first cell transistor connected to the first leakage field generation layer;
a first bit line connected to the first cell transistor;
a second cell transistor connected to the second leakage field generation layer;
a second bit line connected to the second cell transistor; and
a word line connected to the first and second transistors.

15. The magnetoresistive device according to claim 1, wherein the spin current generation layer is comprised of a nonmagnetic material.

16. A method of recording information using a magnetoresistive device that includes a spin current generation layer, a magnetic free layer having a domain wall and a leakage field generation layer generating a leakage field, the method comprising:
generating a spin current by flowing a majority of an electric current flowing in the magnetoresistive device in the spin current generation layer;
moving the domain wall in the magnetic free layer by the generated spin current; and
stabilizing a position of the domain wall by the leakage field generated in the leakage field generation layer, thereby recording the information corresponding to the position of the domain wall.

17. The method of recording information according to claim 16, wherein wherein the spin current generation layer is comprised of a nonmagnetic material.

* * * * *